US012620427B2

(12) United States Patent
Hatsuda

(10) Patent No.: US 12,620,427 B2
(45) Date of Patent: May 5, 2026

(54) STORAGE DEVICE AND DRIVING METHOD OF STORAGE DEVICE BASED ON ADDRESS CONVERSION

(71) Applicant: Kioxia Corporation, Tokyo (JP)

(72) Inventor: Kosuke Hatsuda, Tokyo (JP)

(73) Assignee: Kioxia Corporation, Tokyo (JP)

( * ) Notice: Subject to any disclaimer, the term of this patent is extended or adjusted under 35 U.S.C. 154(b) by 99 days.

(21) Appl. No.: 18/595,065

(22) Filed: Mar. 4, 2024

(65) Prior Publication Data

US 2024/0321334 A1     Sep. 26, 2024

(30) Foreign Application Priority Data

Mar. 23, 2023    (JP) ................................. 2023-046848

(51) Int. Cl.
*G11C 11/16*      (2006.01)
*G11C 29/12*      (2006.01)
(52) U.S. Cl.
CPC .... *G11C 11/1653* (2013.01); *G11C 29/12005* (2013.01); *G11C 2029/1202* (2013.01); *G11C 2029/1204* (2013.01)

(58) Field of Classification Search
CPC ............ G11C 11/1653; G11C 11/1673; G11C 11/1675; G11C 11/165; G11C 11/1655; G11C 11/1657; G11C 29/12005; G11C 2029/1202; G11C 2029/1204
See application file for complete search history.

(56) References Cited

U.S. PATENT DOCUMENTS

| | | | |
|---|---|---|---|
| 4,267,561 A * | 5/1981 | Karpinsky ............. H04N 11/00 |
| | | | 381/56 |
| 10,387,276 B2 | 8/2019 | Ryu et al. |
| 10,761,747 B2 | 9/2020 | Hong et al. |
| 10,901,847 B2 | 1/2021 | Shani et al. |
| 2001/0053091 A1 * | 12/2001 | Futatsuya ............ G11C 7/1078 |
| | | | 365/185.11 |
| 2010/0161883 A1 | 6/2010 | Kurashige |
| 2015/0236716 A1 | 8/2015 | Fukuda |

* cited by examiner

*Primary Examiner* — Sultana Begum
(74) *Attorney, Agent, or Firm* — Kim & Stewart LLP

(57)    ABSTRACT
According to one embodiment, there is provided a storage device comprising a first memory chip that includes a plurality of first memory cells and that includes a first circuit configured to perform address conversion by using a conversion function; and a second circuit that is connected to the first memory chip and that is configured to set a first parameter for the first memory chip, wherein when a first address is transmitted to the first memory chip from the second circuit, the first address is converted into a second address by the conversion function using the first parameter, and then one of the plurality of first memory cells that corresponds to the second address in the first memory chip is accessed.

16 Claims, 23 Drawing Sheets

ADD (30 BITS): 00010...01001 a4 a3 a2 a1 a0

PRM (4 BITS): 0101 p3 p2 p1 p0

Figure 7:
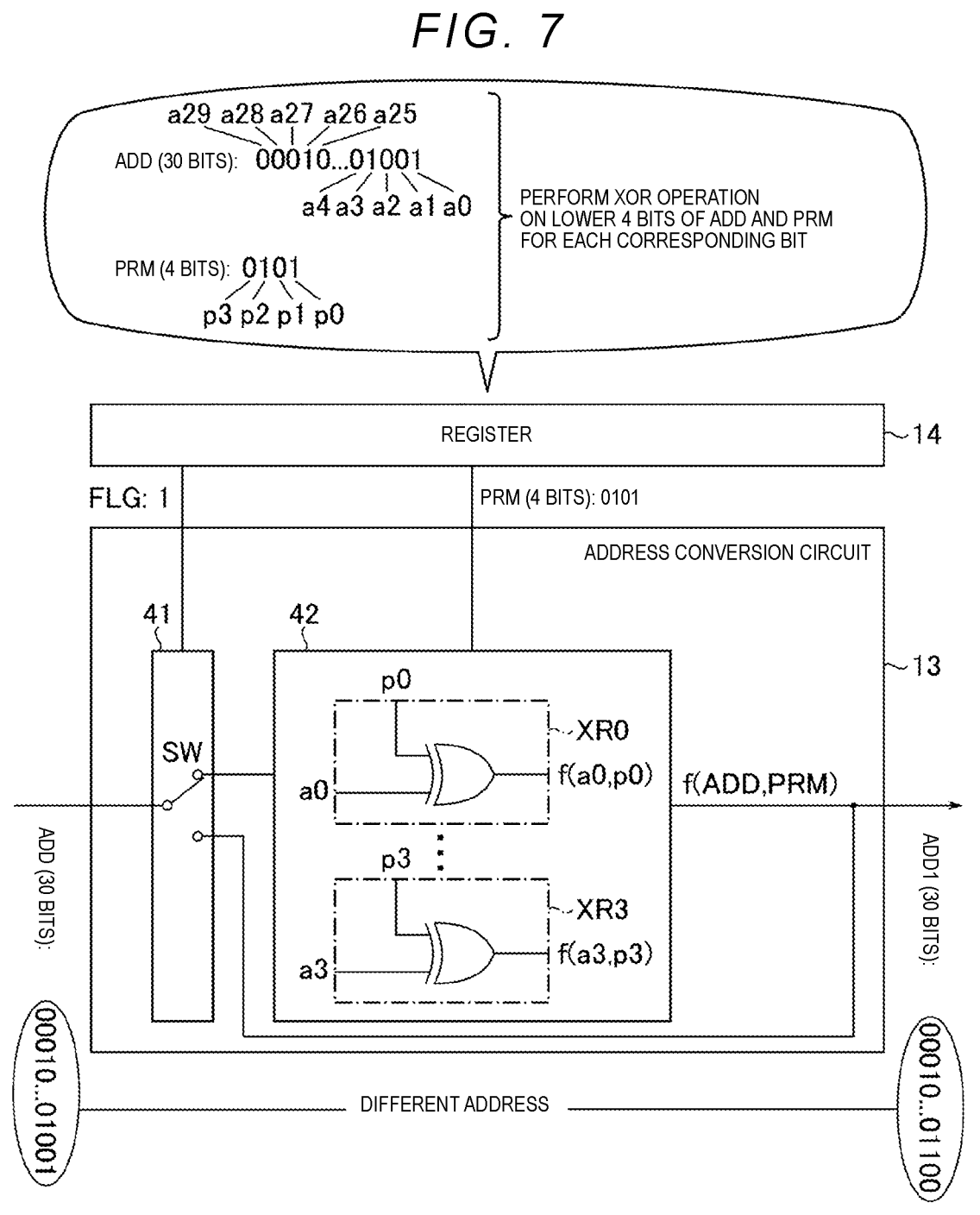

PERFORM XOR OPERATION
ON LOWER 4 BITS OF ADD AND PRM
FOR EACH CORRESPONDING BIT

REGISTER ~14

FLG: 1 PRM (4 BITS): 0101

ADDRESS CONVERSION CIRCUIT

~13

41 42

SW p0

XR0 a0 f(a0,p0) f(ADD,PRM)

p3

XR3 a3 f(a3,p3)

ADD (30 BITS): 00010...01001

ADD1 (30 BITS): 00010...01100

DIFFERENT ADDRESS

START

TURN ON POWER OF CHIP   ~S100

STORE CONVERSION PARAMETER IN REGISTER   ~S101

STORE CONVERSION FLAG IN REGISTER   ~S102

END

FIG. 10

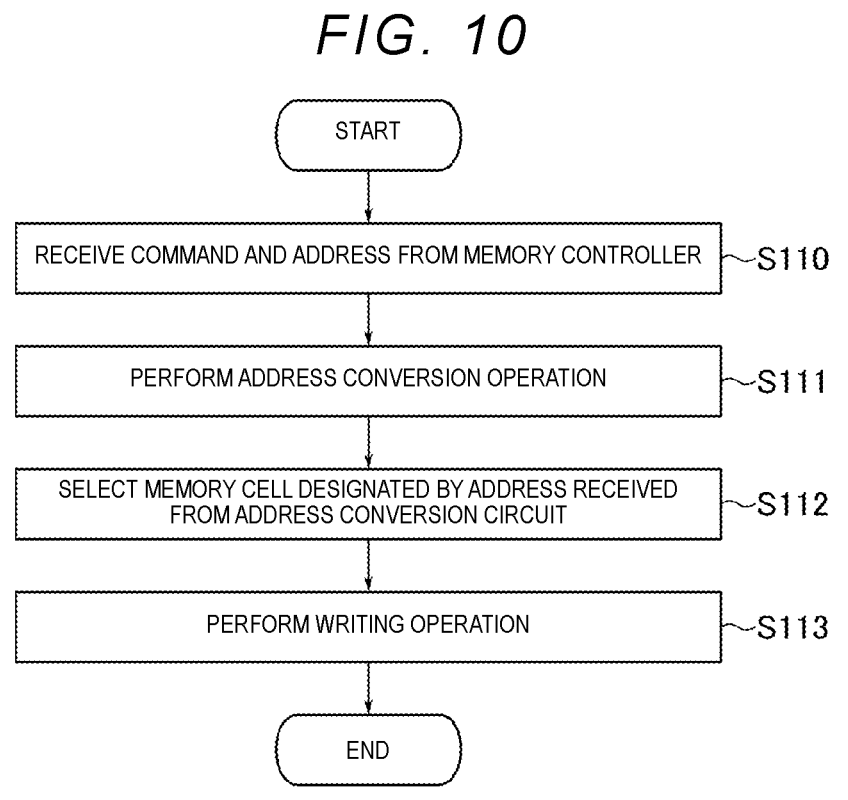

```
                    ┌─────────────┐
                    │    START    │
                    └──────┬──────┘
                           │
                           ▼
  ┌─────────────────────────────────────────────────────┐
  │ RECEIVE COMMAND AND ADDRESS FROM MEMORY CONTROLLER   │──S110
  └────────────────────────┬────────────────────────────┘
                           │
                           ▼
  ┌─────────────────────────────────────────────────────┐
  │       PERFORM ADDRESS CONVERSION OPERATION           │──S111
  └────────────────────────┬────────────────────────────┘
                           │
                           ▼
  ┌─────────────────────────────────────────────────────┐
  │ SELECT MEMORY CELL DESIGNATED BY ADDRESS RECEIVED    │──S112
  │          FROM ADDRESS CONVERSION CIRCUIT             │
  └────────────────────────┬────────────────────────────┘
                           │
                           ▼
  ┌─────────────────────────────────────────────────────┐
  │            PERFORM WRITING OPERATION                 │──S113
  └────────────────────────┬────────────────────────────┘
                           │
                           ▼
                    ┌─────────────┐
                    │     END     │
                    └─────────────┘
```

*FIG. 15*

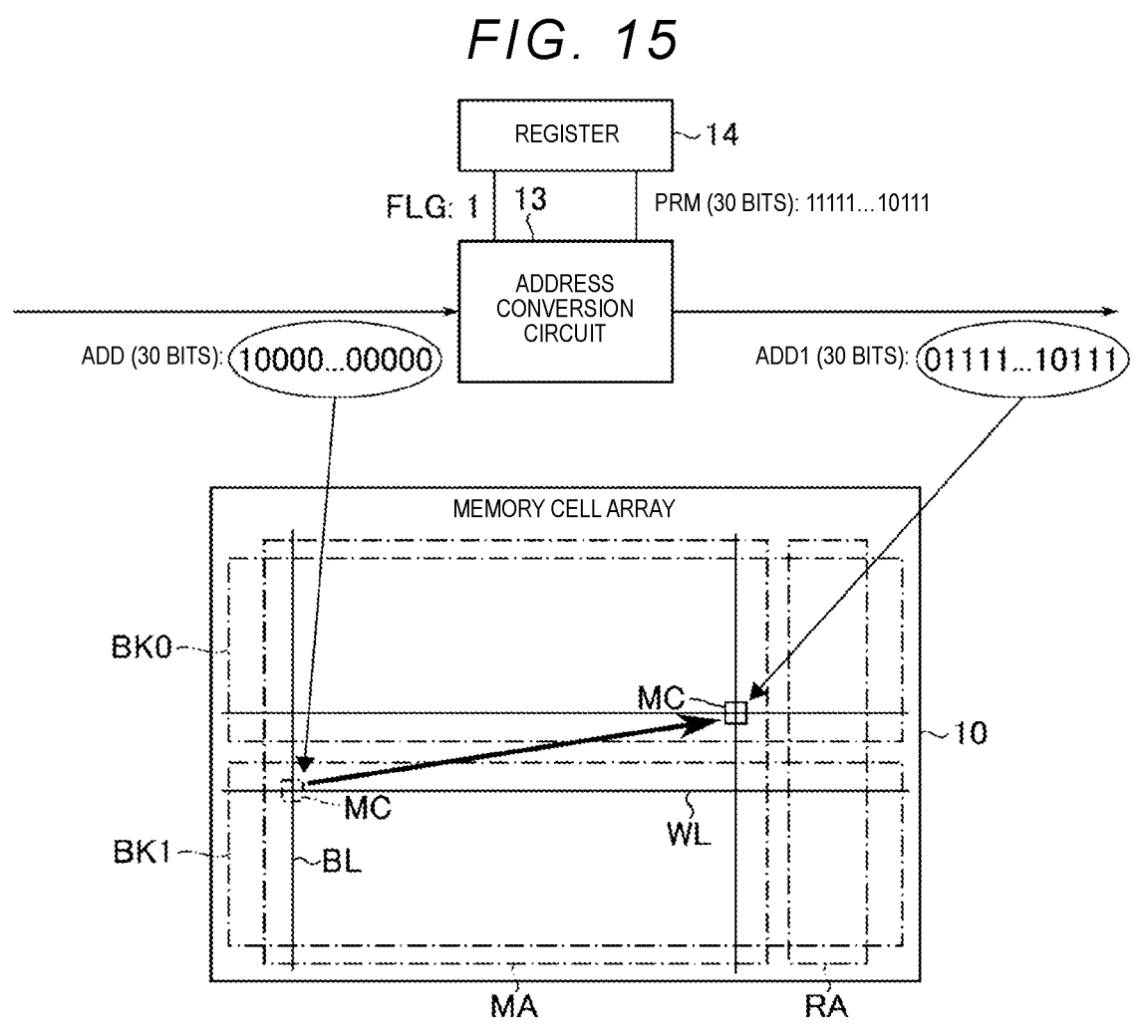

REGISTER ~14

FLG: 1 | 13    PRM (30 BITS): 11111...10111

ADDRESS
CONVERSION
CIRCUIT

ADD (30 BITS): 10000...00000    ADD1 (30 BITS): 01111...10111

MEMORY CELL ARRAY

BK0

MC

~10

MC

WL

BK1

BL

MA    RA

WHEN MOST SIGNIFICANT BIT OF ADD IS 1

FIG. 21

| ADDRESS OF DEFECTIVE CELL MC | ADDRESS OF REDUNDANCY CELL MCr |
|---|---|
| 00000...00000 | 00000...11000 |
| 00000...00011 | 00000...11011 |
| 00000...00110 | 00000...11110 |
| ⋮ | ⋮ |

CHIP 16  10

Figure 22:
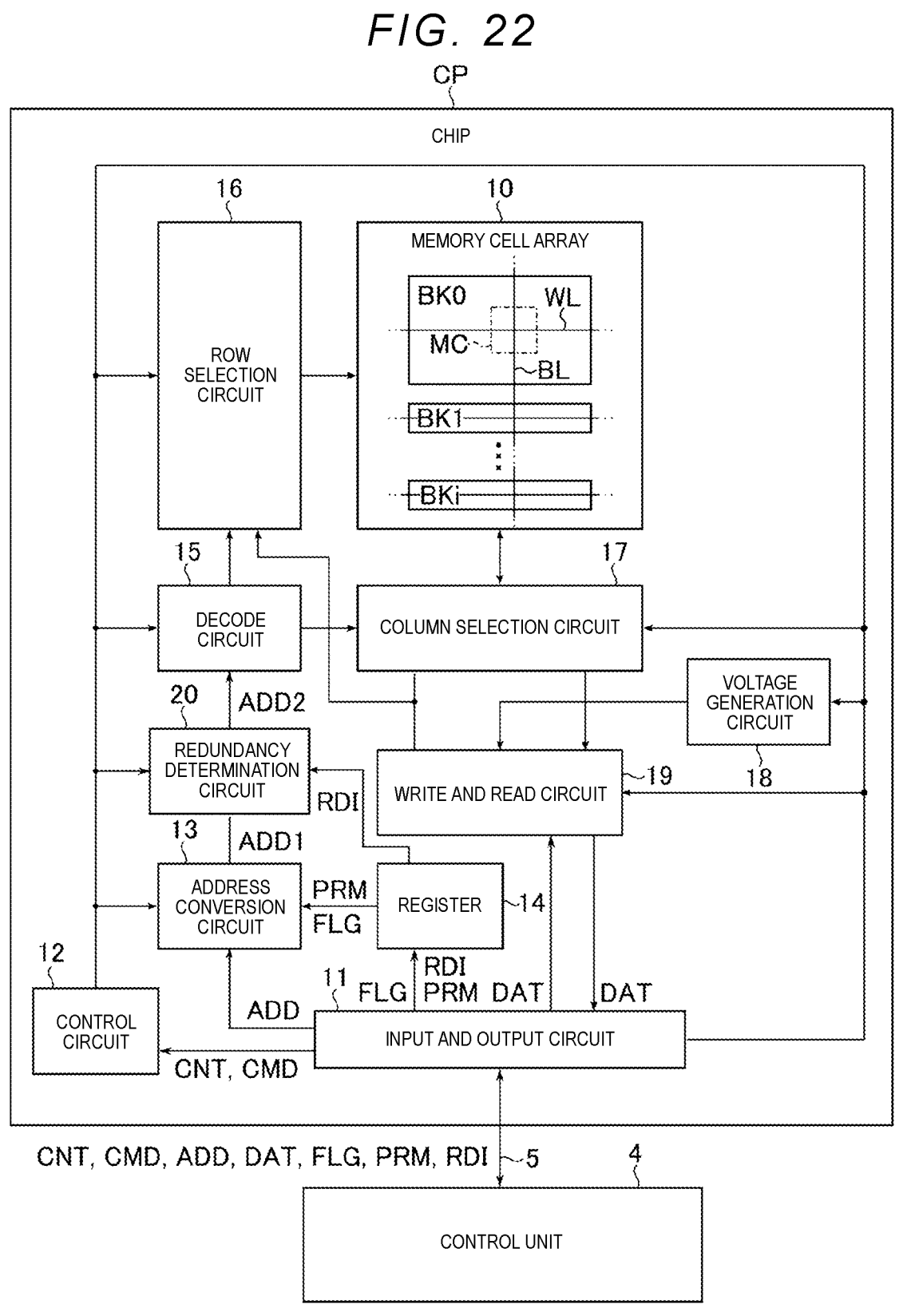

MEMORY CELL ARRAY

ROW
SELECTION
CIRCUIT

BK0  WL

MC

~BL

BK1

BKi 15  17

DECODE
CIRCUIT

COLUMN SELECTION CIRCUIT

20  ADD2

VOLTAGE
GENERATION
CIRCUIT

REDUNDANCY
DETERMINATION
CIRCUIT

RDI

WRITE AND READ CIRCUIT  ~19  18

13  ADD1

ADDRESS
CONVERSION
CIRCUIT

PRM  REGISTER  ~14

FLG

12

RDI

11  FLG  PRM  DAT  DAT

CONTROL
CIRCUIT

ADD

INPUT AND OUTPUT CIRCUIT

CNT, CMD

CNT, CMD, ADD, DAT, FLG, PRM, RDI  ~5  4

CONTROL UNIT

STORAGE DEVICE AND DRIVING METHOD OF STORAGE DEVICE BASED ON ADDRESS CONVERSION

CROSS-REFERENCE TO RELATED APPLICATION

This application is based upon and claims the benefit of priority from Japanese Patent Application No. 2023-046848, filed Mar. 23, 2023, the entire contents of which are incorporated herein by reference.

FIELD

Embodiments described herein relate generally to a storage device and a driving method of the storage device.

BACKGROUND

A storage device using a variable resistance element as a storage element is known. For example, a magnetoresistive random access memory (MRAM) in which a magnetoresistance effect element is used as a variable resistance element is known.

DESCRIPTION OF THE DRAWINGS

FIG. 1 is a block diagram showing an example of a configuration of the memory system including a storage device according to a first embodiment.

FIG. 2 is a block diagram showing an example of a configuration of a memory chip provided in the storage device according to the first embodiment.

FIG. 4 is a cross-sectional view showing an example of a structure of a magnetoresistance effect element provided in the storage device according to the first embodiment.

FIG. 6 is a diagram illustrating an example of a specific process of a conversion function used in an address conversion circuit provided in the storage device according to the first embodiment.

FIG. 7 is a diagram illustrating another example of the specific processing of the conversion function used in the address conversion circuit provided in the storage device according to the first embodiment.

FIG. 10 is a flowchart showing an example of an address conversion operation of a chip provided in the storage device according to the first embodiment.

FIG. 15 is a diagram showing a relationship between a memory cell designated by an address before address conversion and a memory cell designated by an address after address conversion in FIG. 14.

FIG. 21 is a conceptual diagram showing an example of redundancy information stored in the storage device according to the second embodiment.

FIG. 22 is a block diagram showing an example of a configuration of a memory chip provided in the storage device according to the second embodiment.

DETAILED DESCRIPTION

Figure 3:
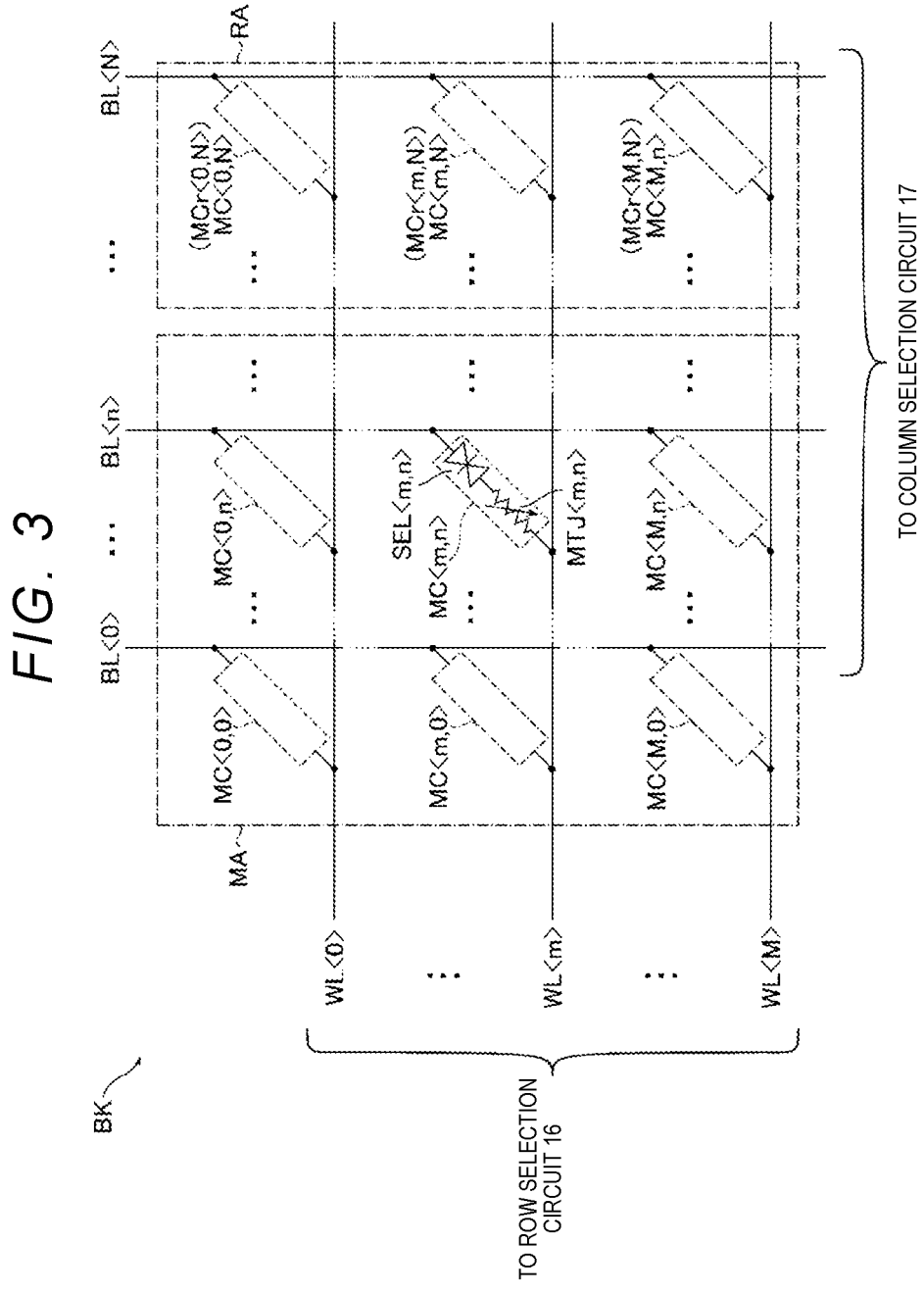
FIG. 3 is a circuit diagram showing an example of a configuration of a memory cell array in the storage device according to the first embodiment.

Embodiments provide a storage device and a driving method of the storage device capable of reducing a defect rate, which is a proportion of defective cells.

In general, according to embodiments, there is provided a storage device comprising a first memory chip that includes a plurality of first memory cells and that includes a first circuit configured to perform address conversion by using a conversion function, and a second circuit that is connected to the first memory chip. The second circuit is configured to set a first parameter for the first memory chip. When a first address is transmitted to the first memory chip from the second circuit, the first address is converted into a second address by the conversion function using the first parameter, and then one of the plurality of first memory cells that corresponds to the second address in the first memory chip is accessed.

Hereinafter, embodiments will be described with reference to drawings. In the following description, the same reference numerals are added to elements having substantially the same function and configuration. Letters or numerals different from each other may be added to the end of the same reference numerals when specifically distinguishing between elements having similar configurations.

1. First Embodiment

A storage device according to a first embodiment will be described. The storage device according to the present embodiment is, for example, a magnetic storage device in which an element having a magnetoresistance effect (also referred to as an MTJ element or a magnetoresistance effect element) is used as a variable resistance element by magnetic tunnel junction (MTJ). In the present embodiment and the modification example to be described later, the MTJ element will be described with a case of being used as a variable resistance element, and will be described as a magnetoresistance effect element MTJ in terms of notation.

1.1 Configuration

1.1.1 Configuration of Memory System

Figure 1:
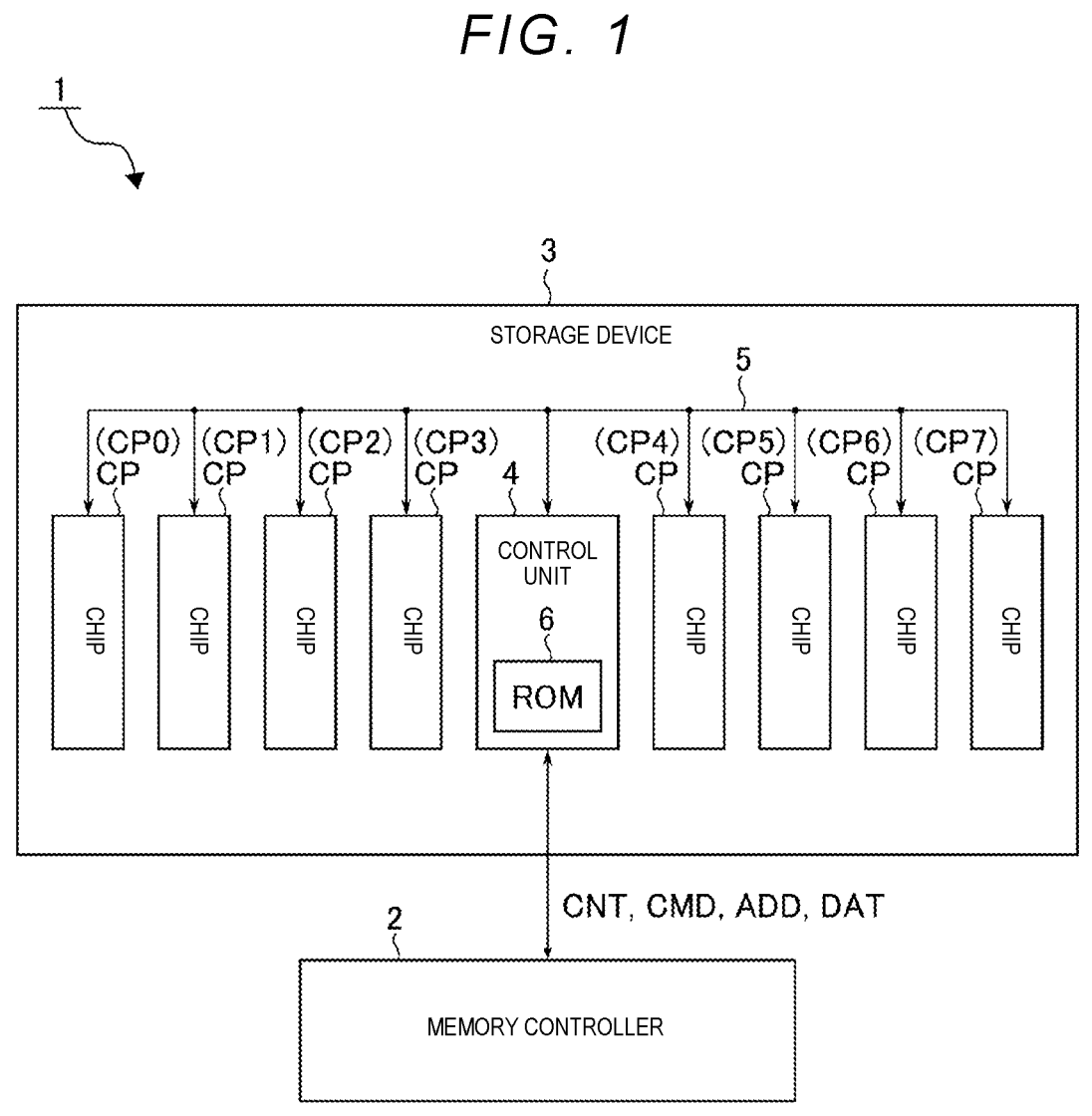

A configuration of the memory system including the storage device according to the first embodiment will be described with reference to FIG. 1. FIG. 1 is a block diagram showing an example of the configuration of the memory system including the storage device according to the present embodiment.

A memory system 1 is a device that stores data. As shown in FIG. 1, the memory system 1 includes a memory controller 2 and a storage device 3.

The memory controller 2 is a device that controls the storage device 3. The memory controller 2 is, for example, a system on a chip (SoC). The memory controller 2 is connected to a host (for example, a server system or the like) which is not shown. The memory controller 2 receives a request signal from the host. The memory controller 2 controls the storage device 3 based on the request signal received from the host or the spontaneous processing request.

In addition, the memory controller 2 includes an error checking and correcting (ECC) circuit which is not shown. The ECC circuit is a circuit that performs an error correction process of the data. Specifically, the ECC circuit generates an error correction code based on write data during a writing operation of data. The ECC circuit generates a syndrome based on the error correction code in a predetermined unit during a reading operation of data, detects an error, and corrects the detected error.

The storage device 3 includes a control unit 4 and a plurality of memory chips (hereinafter, simply referred to as "chips") CP.

The control unit 4 is a circuit that controls the operation of the entire storage device 3. The control unit 4 is a circuit that controls communication between the memory controller 2 and the plurality of chips CP. The control unit 4 is connected to the memory controller 2 via a bus. The control unit 4 is connected to the plurality of chips CP via a bus 5.

The control unit 4 includes a read only memory (ROM) 6. The ROM 6 is a nonvolatile memory. The ROM 6 stores a program such as firmware, redundancy information (table) RDI, an address conversion flag (hereinafter, simply referred to as a "conversion flag") FLG, and an address conversion parameter (hereinafter, simply referred to as a "conversion parameter") PRM. The redundancy information RDI is information indicating a correspondence relationship between a defective memory cell to be described later and a redundancy cell to be described later. The conversion flag FLG is information indicating whether to enable address conversion to be described later. For example, the conversion flag FLG is set to "1" when the address conversion is enabled, and is set to "0" when the address conversion is disabled. The conversion parameter PRM is a parameter used for address conversion. The redundancy information RDI, the conversion flag FLG, and the conversion parameter PRM are stored for each chip CP. The redundancy information RDI, the conversion flag FLG, and the conversion parameter PRM may be stored in a memory cell array to be described later in the chip CP.

The control unit 4 receives a control signal CNT, a command CMD, an address ADD, and data DAT from the memory controller 2. The control unit 4 transmits the received control signal CNT, the command CMD, the address ADD, and the data DAT to the plurality of chips CP via the bus 5. The control unit 4 transmits the same address ADD to the plurality of chips CP. For example, at the time of the writing operation or the reading operation (access to a plurality of chips CP), the same address is transmitted to the plurality of chips CP at the same time. The control unit 4 transmits the conversion flag FLG and the conversion parameter PRM stored in the ROM 6 for each chip CP to the corresponding chip CP via the bus 5. The control unit 4 receives the data DAT from the plurality of chips CP via the bus 5. The control unit 4 transmits the received data DAT to the memory controller 2.

Each chip CP is, for example, a magnetic storage device using an MTJ element as a variable resistance element. In other words, the storage device 3 is a magnetic storage device including a plurality of chips CP. FIG. 1 shows a case where the number of chips CP provided in the storage device 3 is 8. Hereinafter, when the eight chips CP are distinguished from each other, the chips CP are denoted as CP0 to CP7. When it is unnecessary to distinguish the eight chips CP from each other, the chips CP are simply referred to collectively as the chips CP or individually as the chip CP. The number of chips CP provided in the storage device 3 is not limited to 8, and may be any number of 2 or more. The chips CP are controlled by the control unit 4.

1.1.2 Configuration of Chips

Figure 2:
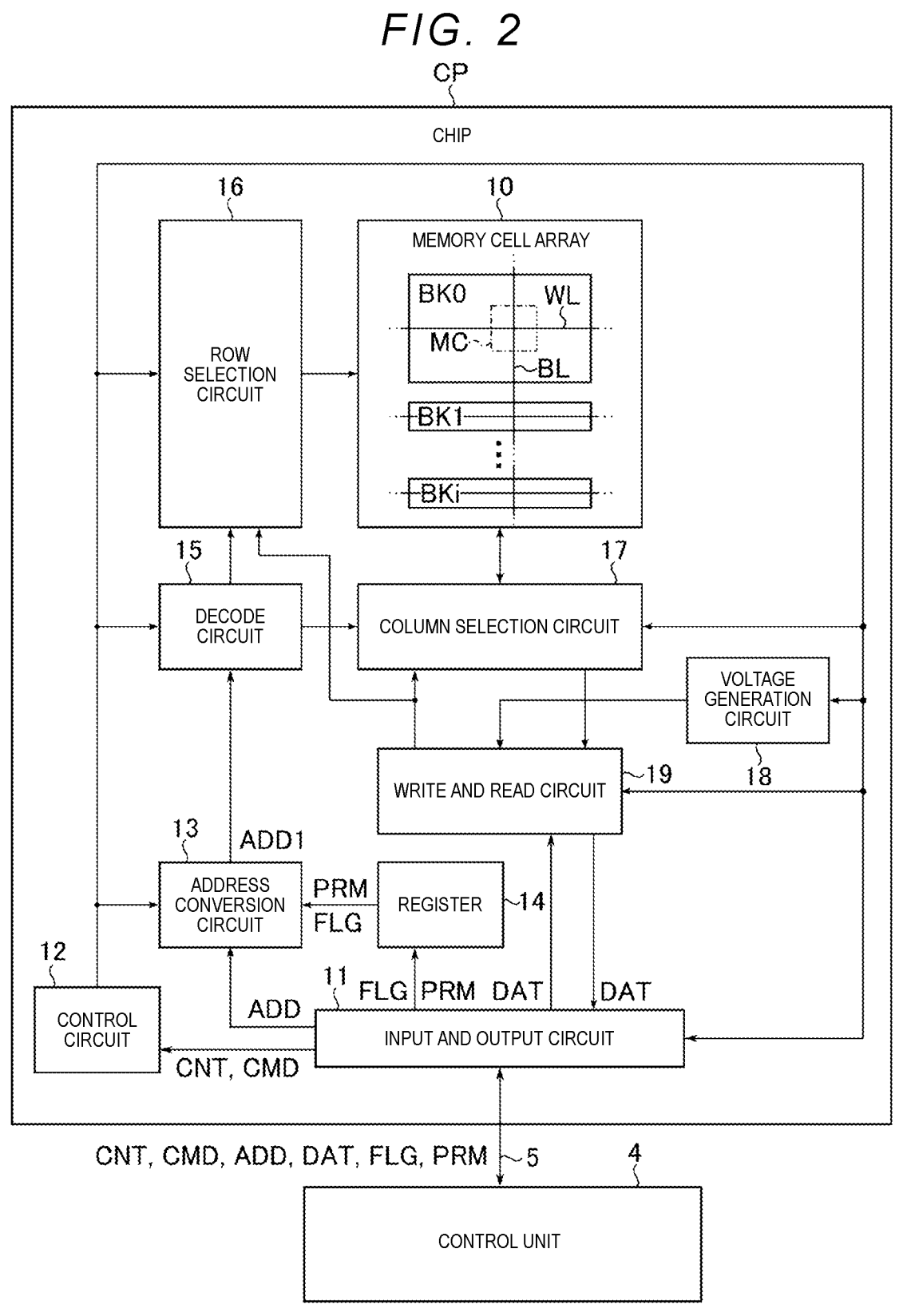

The configuration of the chip CP will be described with reference to FIG. 2. FIG. 2 is a block diagram showing an example of the configuration of the chip CP.

As shown in FIG. 2, the chip CP includes a memory cell array 10, an input and output circuit 11, a control circuit 12, an address conversion circuit 13, a register 14, a decode circuit 15, a row selection circuit 16, a column selection circuit 17, a voltage generation circuit 18, and a write and read circuit 19.

The memory cell array 10 is a nonvolatile memory. The memory cell array 10 includes a plurality of memory cells MC, each of which is associated with a combination of a row and a column. The memory cell MC stores data in a nonvolatile manner. The memory cells MC in the same row are connected to the same word line WL. The memory cells MC in the same column are connected to the same bit line BL. In addition, the memory cell array 10 includes a plurality of banks BK0 to BKi (i is an integer of 1 or more). Hereinafter, it is unnecessary to distinguish the banks BK0 to BKi from each other, the banks are simply referred to collectively as banks BK or individually as a bank BK. The bank BK includes a plurality of memory cells MC. More details of the memory cell array 10 will be described below.

The input and output circuit 11 is a circuit that transmits and receives data. The input and output circuit 11 receives the control signal CNT, the command CMD, the address ADD, the data (write data) DAT, the conversion flag FLG, and the conversion parameter PRM from the control unit 4 via the bus 5. The write data is data written into the memory cell array 10. The input and output circuit 11 transmits the control signal CNT and the command CMD to the control circuit 12. The input and output circuit 11 transmits the address ADD to the address conversion circuit 13. The input and output circuit 11 transmits the data (write data) DAT to the write and read circuit 19. The input and output circuit 11 transmits the conversion flag FLG and the conversion parameter PRM to the register 14. The input and output circuit 11 receives the data (read data) DAT from the write and read circuit 19. The read data is data read from the memory cell array 10. The input and output circuit 11 transmits the data (read data) DAT to the control unit 4 via the bus 5.

The control circuit 12 is a circuit that controls the operation of the entire chip CP. The control circuit 12 controls the operations of the input and output circuit 11, the address conversion circuit 13, the decode circuit 15, the row selection circuit 16, the column selection circuit 17, the voltage generation circuit 18, and the write and read circuit 19 based on the control signal CNT and command CMD.

The address conversion circuit 13 is a circuit that performs address conversion. The address conversion is a process of converting the address ADD transmitted from the input and output circuit 11. The address conversion circuit 13 receives the address ADD from the input and output circuit 11. The address conversion circuit 13 acquires the conversion flag FLG and the conversion parameter PRM from the register 14. When the conversion flag FLG is "1" (the address conversion is enabled), the address conversion circuit 13 converts the address ADD based on the conversion parameter PRM. The address conversion circuit 13 transmits the converted address to the decode circuit 15 as an address ADD1. On the other hand, when the conversion flag FLG is "0" (the address conversion is disabled), the address conversion circuit 13 does not convert the address ADD. The address conversion circuit 13 transmits the received address ADD as an address ADD1 to the decode circuit 15. The details of the address conversion circuit 13 will be described further later.

The register 14 is a circuit that stores the conversion flag FLG and the conversion parameter PRM. The register 14 receives the conversion flag FLG and the conversion parameter PRM from the input and output circuit 11.

The decode circuit 15 is a circuit that decodes the address ADD1. The decode circuit 15 receives the address ADD1 from the address conversion circuit 13. The decode circuit 15 decodes the address ADD1. The decode circuit 15 transmits the decode result of the address ADD1 to the row selection circuit 16 and the column selection circuit 17. The address ADD1 includes a row address and a column address.

The row selection circuit 16 is a circuit that selects a word line WL corresponding to a row of the memory cell array 10. The row selection circuit 16 is connected to the memory cell array 10 via word lines WL. The row selection circuit 16 receives the decode result (row address) of an address ADD1 from the decode circuit 15. The row selection circuit 16 selects the word line WL corresponding to the row based on the decode result of the address ADD1.

The column selection circuit 17 is a circuit that selects a bit line BL corresponding to a column of the memory cell array 10. The column selection circuit 17 is connected to the memory cell array 10 via bit lines BL. The column selection circuit 17 receives the decode result (column address) of the address ADD1 from the decode circuit 15. The column selection circuit 17 selects the bit line BL corresponding to the column based on the decode result of the address ADD1.

The voltage generation circuit 18 is a circuit that generates a voltage for various operations of the chip CP using a power supply voltage (a voltage VDD) applied from the outside of the chip CP (storage device 3). The various operations are, for example, a writing operation, a reading operation, and an erasing operation. The voltage generation circuit 18 generates a voltage (hereinafter, also referred to as a "write voltage") used in the writing operation. The voltage generation circuit 18 supplies the write voltage to the write and read circuit 19. In addition, the voltage generation circuit 18 generates a voltage (hereinafter, also referred to as a "read voltage") used in the reading operation. The voltage generation circuit 18 supplies the read voltage to the write and read circuit 19.

The write and read circuit 19 is a circuit that writes data to the memory cell MC and reads data from the memory cell MC.

The write and read circuit 19 includes a write driver (not shown). The write and read circuit 19 receives the write data DAT from the input and output circuit 11. A write voltage is applied to the write and read circuit 19 by the voltage generation circuit 18. The write driver is, for example, a constant current driver circuit. The write driver is configured to supply a current (a current used in a writing operation, and hereinafter, referred to as a "write current") which is based on the write voltage, to the row selection circuit 16 or the column selection circuit 17. The row selection circuit 16 supplies a write current to the memory cell array 10 via the selected word line WL. The column selection circuit 17 supplies a write current to the memory cell array 10 via the selected bit line BL.

In addition, the write and read circuit 19 includes a read driver (not shown) and a sense amplifier (not shown). The write and read circuit 19 applies a read voltage from the voltage generation circuit 18. The read driver is, for example, a constant current driver circuit. The read driver is configured to supply a current (a current used in a reading operation, and hereinafter, referred to as a "read current") which is based on the read voltage, to the column selection circuit 17. The column selection circuit 17 supplies a read current to the memory cell array 10 via the selected bit line BL. The sense amplifier derives the data stored in the memory cell MC based on the voltage of the bit line BL. The write and read circuit 19 transmits the derived data to the input and output circuit 11 as read data DAT.

1.1.3 Configuration of Memory Cell Array

The configuration of the memory cell array 10 will be described with reference to FIG. 3. FIG. 3 is a circuit diagram showing an example of the configuration of the memory cell array 10. FIG. 3 shows a circuit configuration of one bank BK provided in the memory cell array 10 as an example of the circuit configuration of the memory cell array 10. The other bank(s) BK also have the same configuration as in FIG. 3. In FIG. 3, the memory cell MC, the word lines WL, and the bit lines BL are illustrated using indexes ("< >").

As shown in FIG. 3, the memory cell array 10 includes a main area MA and a redundancy area RA. The main area MA is mainly an area used for storing data from the outside. When a defective memory cell MC (hereinafter, referred to as "defective cell MC") or a defective bit line BL (hereinafter, "defective bit line BL") is present in the main area MA, the redundancy area RA is an area that is used instead of a memory cell MC connected to the defective cell MC and the defective bit line BL.

The memory cells MC are arranged in a matrix in the memory cell array 10. In other words, the main area MA includes a plurality of memory cells MC arranged in a matrix shape. The redundancy area RA includes the plurality of memory cells MC arranged in a matrix shape. Hereinafter, the memory cells MC in the redundancy area RA are also referred to collectively as "redundancy cells MCr" or individually as a "redundancy cell MCr." The memory cell MC is associated with a combination of one of a plurality of word lines WL (WL<0>, . . . , WL<m>, . . . , WL<M>) and one of a plurality of bit lines BL (BL<0>, . . . , BL<n>, . . . , BL<N>) (M and N are integers of 1 or more). That is, the memory cell MC<m,n> where (0≤m≤M, 0≤n≤N) is connected between the word line WL<m> and the bit line BL<n>. The word line WL<m> is connected to the row selection circuit 16. The bit line BL<n> is connected to the column selection circuit 17. The memory cell MC<m,n> includes a switching element SEL<m,n> and a magnetoresistance effect element MTJ<m,n> which are connected in series.

The switching element SEL is a two-terminal type switching element. The two-terminal type switching element is different from a three-terminal type switching element such as a transistor in that the two-terminal type switching element does not include a third terminal. More specifically, when the voltage applied to the corresponding memory cell MC is lower than the threshold voltage Vth, the switching element SEL cuts off a current (is turned off) as an insulator having a large resistance value. When the voltage applied to the corresponding memory cell MC is equal to or greater than the threshold voltage Vth, the switching element SEL passes a current (is turned on) as a conductor having a small resistance value. The switching elements SEL switches whether to pass or cut off the current depending on the magnitude of the voltage applied to the corresponding memory cell MC regardless of the polarity of the voltage applied between the two terminals (regardless of the direction of the flowing current).

With the above-described configuration, when the memory cell MC is selected, the switching element SEL in the selected memory cell MC is turned on. Accordingly, a current can be caused to flow through the magnetoresistance effect element MTJ in the selected memory cell MC.

The magnetoresistance effect element MTJ can switch the resistance value between a low resistance state and a high resistance state based on the current that flows when the switching element SEL is turned on. The magnetoresistance effect element MTJ stores data in a non-volatile manner by changing the resistance state.

1.1.4 Structure of Magnetoresistance Effect Element

Figure 4:
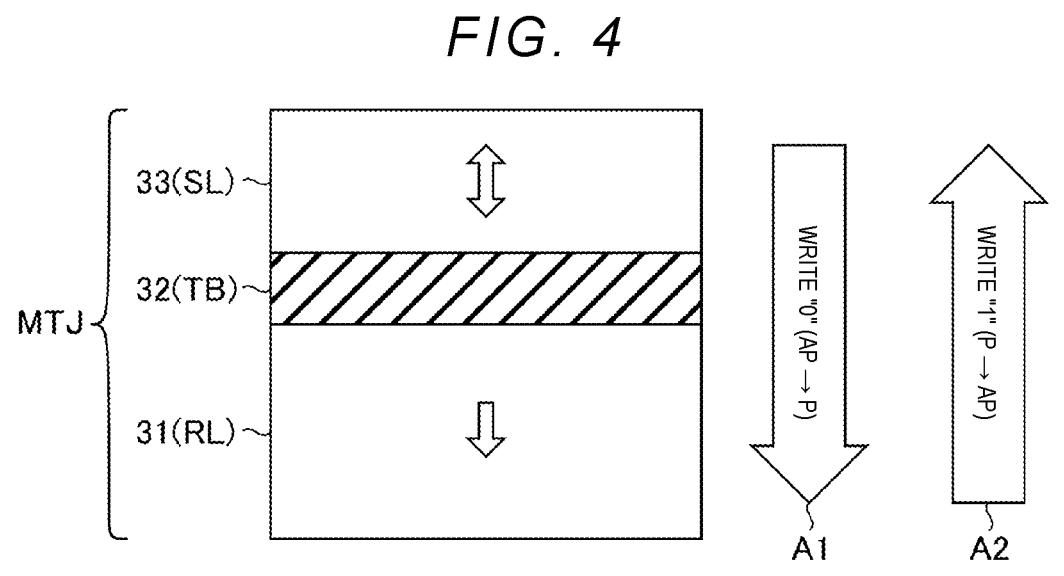

The structure of the magnetoresistance effect element MTJ will be described with reference to FIG. 4. FIG. 4 is a cross-sectional view showing an example of the structure of the magnetoresistance effect element MTJ.

As shown in FIG. 4, the magnetoresistance effect element MTJ includes a ferromagnetic material 31 functioning as a reference layer (RL), a non-magnetic material 32 functioning as a tunnel barrier layer (TB), and a ferromagnetic material 33 functioning as a storage layer (SL). The ferromagnetic material 31, the non-magnetic material 32, and the ferromagnetic material 33 are, for example, stacked in this order on the semiconductor substrate which is not shown. The magnetoresistance effect element MTJ functions as, for example, a perpendicular magnetization type magnetoresistance effect element MTJ in which each of the magnetization directions of the magnetic materials forming the magnetoresistance effect element MTJ face a direction perpendicular to the film surface.

The ferromagnetic material 31 has ferromagnetism and has an easy axis of magnetization in a direction perpendicular to the film surface. The ferromagnetic material 31 contains, for example, cobalt iron boron (CoFeB) or iron boride (FeB). The magnetization direction of the ferromagnetic material 31 is fixed, and in FIG. 4, the ferromagnetic material 31 faces a surface opposite to the surface on which the non-magnetic material 32 is provided. The phrase "the magnetization direction is fixed" means that the magnetization direction does not change due to a current (spin torque) having a magnitude that can reverse the magnetization direction of the ferromagnetic material 33.

The non-magnetic material 32 is a non-magnetic insulating film and contains, for example, magnesium oxide (MgO). The non-magnetic material 32 is provided between the ferromagnetic material 31 and the ferromagnetic material 33. As a result, the ferromagnetic material 31, the non-magnetic material 32, and the ferromagnetic material 33 create a magnetic tunnel junction.

The ferromagnetic material 33 has ferromagnetism and has an easy magnetization axis direction in a direction perpendicular to the film surface. The ferromagnetic material 33 may include, for example, cobalt iron boron (CoFeB) or iron boride (FeB) and may have a body-centered cubic (bcc) crystal structure. The magnetization direction of the ferromagnetic material 33 is variable.

The magnetoresistance effect element MTJ can take either a low resistance state or a high resistance state depending on whether the relative relationship between the magnetization directions of the storage layer SL and the reference layer RL are parallel or anti-parallel. Hereinafter, a case where a spin injection writing method is used as a method of changing the resistance state of the magnetoresistance effect element MTJ will be described. In the spin injection writing method, a spin torque is generated by flowing a writing current through the magnetoresistance effect element MTJ. The spin torque generated controls the magnetization direction of the storage layer SL with respect to the magnetization direction of the reference layer RL.

When a write current Iw0 having a certain magnitude is made to flow in the direction of the arrow A1 in FIG. 4, that is, in the direction from the storage layer SL toward the reference layer RL into the magnetoresistance effect element MTJ, the relative relationship between the magnetization directions of the storage layer SL and the reference layer RL becomes parallel. In a case of the parallel state, the resistance value of the magnetoresistance effect element MTJ is the lowest, and the magnetoresistance effect element MTJ is set to a low resistance state. This low resistance state is called a "P (parallel) state" and is defined as, for example, a state of data "0". Hereinafter, the operation of setting the magnetoresistance effect element MTJ to a low-resistance state by flowing a write current from the storage layer SL to the reference layer RL is referred to as "writing of '0'".

In addition, when a write current Iw1 larger than the write current Iw0 is made to flow in the direction of the arrow A2 in FIG. 4, that is, in the direction from the reference layer RL toward the storage layer SL into the magnetoresistance effect element MTJ, the relative relationship between the magnetization directions of the storage layer SL and the reference layer RL becomes anti-parallel. In a case of the anti-parallel state, the resistance value of the magnetoresistance effect element MTJ is the highest, and the magnetoresistance effect element MTJ is set to a high resistance state. This high resistance state is called an "AP (anti-parallel) state" and is defined as, for example, a state of data "1". Hereinafter, the operation of setting the magnetoresistance effect element MTJ to a high-resistance state by flowing a write current from the reference layer RL to the storage layer SL is referred to as "writing of '1'".

In addition, when the read current Ir0 is caused to flow through the magnetoresistance effect element MTJ, the magnetization directions of the storage layer SL and the reference layer RL do not change. The sense amplifier determines whether the resistance state of the magnetoresistance effect element MTJ is the P state or the AP state based on the voltage of the bit line BL. Accordingly, the sense amplifier can read data from the memory cell MC.

The method of defining data "1" and data "0" is not limited to the above-mentioned example. For example, the P state may be defined as data "1" and the AP state may be defined as data "0".

1.1.5 Configuration of Address Conversion Circuit

Figure 5:
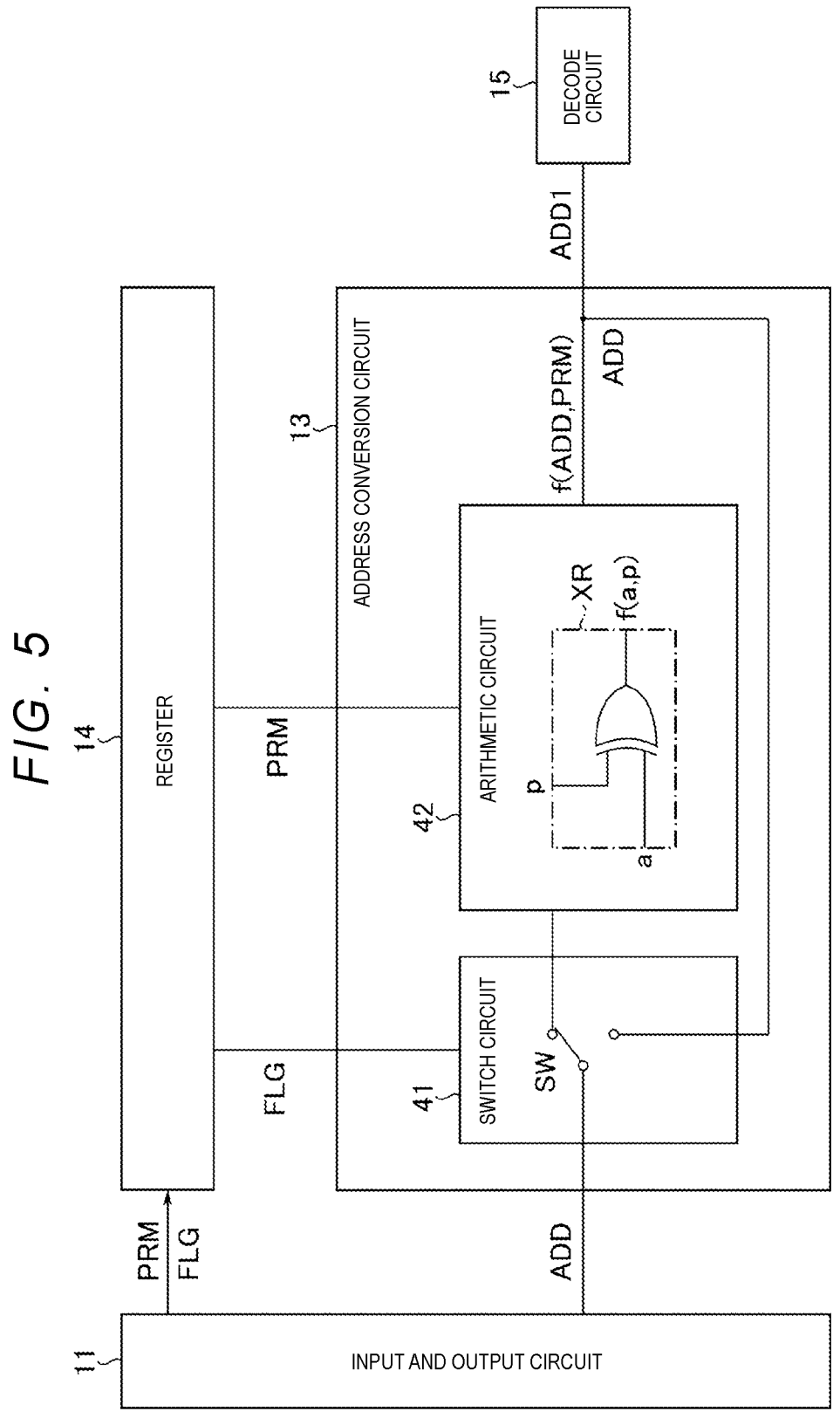
FIG. 5 is a circuit diagram showing an example of a configuration of an address conversion circuit in a memory chip provided in the storage device according to the first embodiment.

The configuration of the address conversion circuit 13 will be described with reference to FIG. 5. FIG. 5 is a circuit diagram showing an example of a configuration of the address conversion circuit 13. FIG. 5 also shows the input and output circuit 11, the register 14, and the decode circuit 15 together with the address conversion circuit 13.

As shown in FIG. 5, the address conversion circuit 13 includes a switch circuit 41 and an arithmetic circuit 42.

The switch circuit 41 is a circuit that switches the validity and invalidity of address conversion. The switch circuit 41 includes a switch SW. The switch SW includes a first terminal, a second terminal, and a third terminal. The switch SW is an element that switches a connection between the input and output circuit 11 and the arithmetic circuit 42 and a connection between the input and output circuit 11 and the decode circuit 15. A first terminal of the switch SW is connected to the input and output circuit 11. The second terminal of the switch SW is connected to the arithmetic circuit 42. The third terminal of the switch SW is connected to the decode circuit 15. The switch circuit 41 receives the address ADD from the input and output circuit 11. The switch circuit 41 receives the conversion flag FLG from the register 14. The switch circuit 41 switches the switch SW based on the conversion flag FLG. As a result, the address ADD is transmitted to the arithmetic circuit 42 or the decode circuit 15.

The arithmetic circuit 42 is a circuit that performs an arithmetic process for address conversion. The arithmetic circuit 42 is connected to the register 14, the switch circuit 41, and the decode circuit 15. The arithmetic circuit 42 receives the conversion parameter PRM from the register 14. The arithmetic circuit 42 receives the address ADD from the switch circuit 41. The arithmetic circuit 42 performs an arithmetic process based on the conversion parameter PRM and the address ADD, and transmits an arithmetic result to the decode circuit 15. Hereinafter, the arithmetic result of the arithmetic circuit 42 is referred to as f(ADD, PRM) using the conversion function f.

The conversion function f is a function of inverting "0" and "1" for specified bits of the address ADD based on the conversion parameter PRM. Specifically, the bit(s) to be inverted among all bits of the address ADD are designated by the conversion parameter PRM. Which bits to invert and the number of bits to invert can be freely determined. The conversion function f inverts a designated bit(s) of the address ADD using the conversion parameter PRM. As a result, the address ADD is converted. In other words, the address conversion circuit 13 performs the address conversion using the conversion function f and the conversion parameter PRM.

As a configuration that realizes the arithmetic process of the conversion function f, the arithmetic circuit 42 includes one or more XOR circuits XR. The XOR circuit XR is a circuit that performs an arithmetic process of an exclusive logical sum. The number of XOR circuits XR provided in the arithmetic circuit 42 is, for example, the same as the number of bits of the conversion parameter PRM. That is, when the conversion parameter PRM is 1 bit, the arithmetic circuit 42 includes one XOR circuit XR. When the conversion parameter PRM is 2 bits, the arithmetic circuit 42 includes two XOR circuits XR. The same applies below. The number of XOR circuits XR provided in the arithmetic circuit 42 may be one or more.

The XOR circuit XR performs an arithmetic operation based on any one bit (hereinafter, referred to as "bit a") of the address ADD and any one bit (hereinafter, referred to as "bit p") of the conversion parameter PRM, and outputs an arithmetic result. Hereinafter, the arithmetic result of the XOR circuit XR is referred to as f(a, p) using the conversion function f. The arithmetic result f(a, p) takes a value obtained by inverting the bit a according to the bit p, or a value obtained by not inverting the bit a.

When the conversion flag FLG is "1", the switch SW connects the input and output circuit 11 and the arithmetic circuit 42. As a result, the address conversion is enabled. The switch circuit 41 transmits the address ADD to the arithmetic circuit 42. The arithmetic circuit 42 converts the address ADD based on the conversion parameter PRM and outputs a converted address f(ADD, PRM). The address conversion circuit 13 transmits f(ADD, PRM) to the decode circuit 15 as the address ADD1. On the other hand, when the conversion flag FLG is "0", the switch SW connects the input and output circuit 11 and the decode circuit 15. As a result, the address conversion is disabled. The switch circuit 41 transmits the address ADD to the decode circuit 15 as the address ADD1.

1.1.6 Conversion Function

Figure 6:
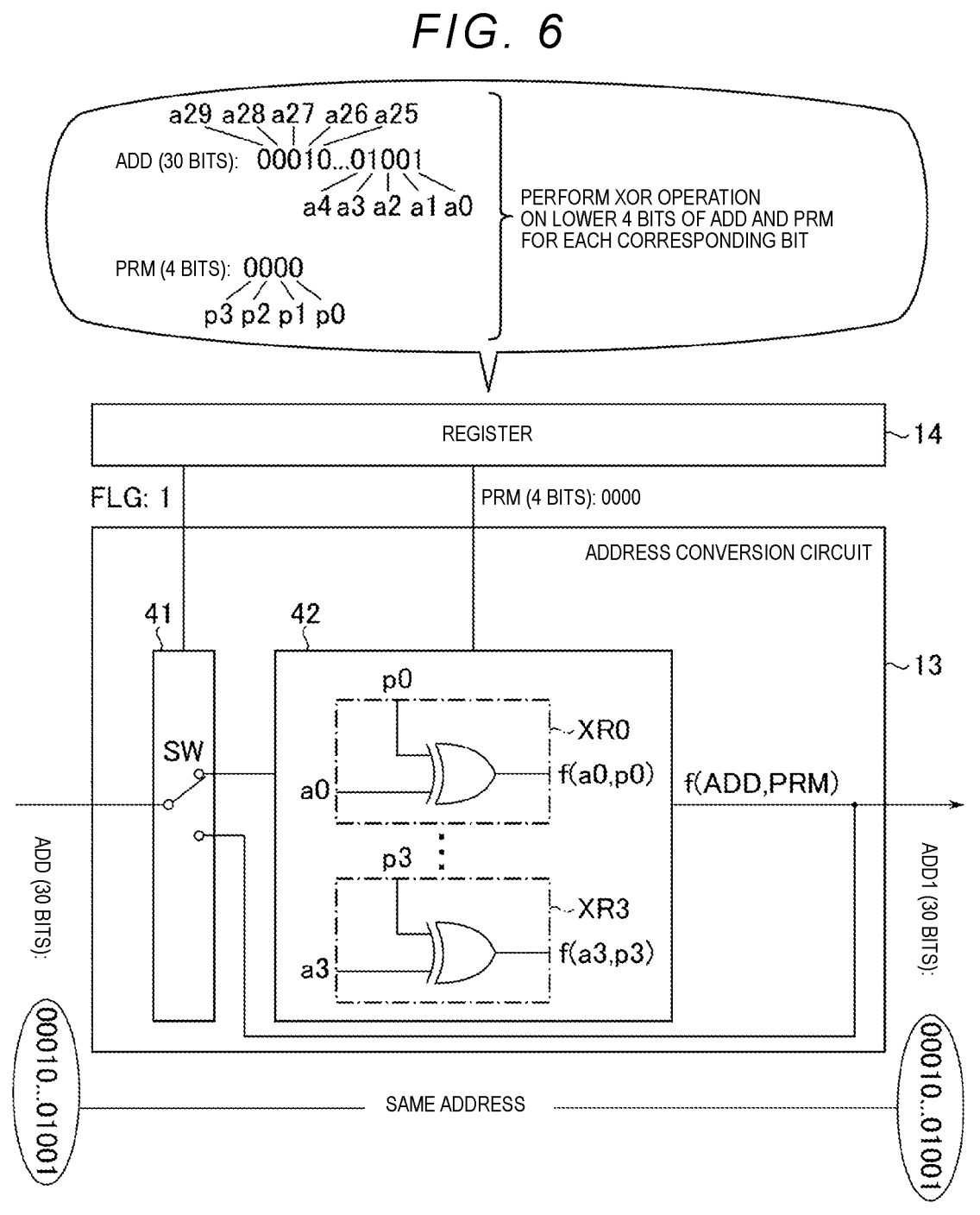

The details of the conversion function f will be described with reference to FIG. 6. FIG. 6 is a diagram illustrating an example of a specific process of the conversion function f.

"1" is set in the register 14 as the conversion flag FLG. As a result, the address conversion is validly set. "0000" (4 bits) is set as the conversion parameter PRM in the register 14. Hereinafter, each of the four bits of the conversion parameter PRM are referred to as p0 to p3.

The arithmetic circuit 42 includes, four XOR circuits XR. Hereinafter, the four XOR circuits XR are respectively referred to as XOR circuits XR0 to XR3, and the arithmetic results of the four XOR circuits XR are respectively referred to as f(a0, p0) to f(a3, p3).

"00010 . . . 01001" (30 bits) is input to the arithmetic circuit 42 as the address ADD. Hereinafter, each of the 30 bits of the address ADD are referred to as a0 to a29. The arithmetic circuit 42 performs an XOR operation on, the lower 4 bits of the address ADD and the conversion parameter PRM for each corresponding bit. That is, the XOR circuit XR0 performs an XOR operation based on the bit p0 and the bit a0. The XOR circuit XR1 performs an XOR operation based on the bit p1 and the bit a1. The same applies below. As a result of the XOR operation, f(a0, p0) has a value in which the bit a0 is not inverted. The same applies to f(a1, p1) to f(a3, p3). Therefore, the arithmetic result f(ADD, PRM) of the arithmetic circuit 42 has the same address as the address ADD ("00010 . . . 01001" (30 bits)). In other words, f(ADD, PRM) is an address that is not changed from the address ADD. The address conversion circuit 13 outputs f(ADD, PRM) as the address ADD1.

FIG. 7 is a diagram illustrating another example of the specific process of the conversion function f. In FIG. 7, the configuration is the same as that in the example of FIG. 6 except that the value of the conversion parameter PRM is different. "0101" (4 bits) is set as the conversion parameter PRM in the register 14.

The arithmetic circuit 42 performs an XOR operation on, the lower 4 bits of the address ADD and the conversion parameter PRM for each corresponding bit. As a result of the XOR operation, f(a0, p0) is a value obtained by inverting the bit a0. f(a1, p1) is a value at which the bit a1 is not inverted. f(a2, p2) is a value obtained by inverting the bit a2. f(a3, p3) is a value at which the bit a3 is not inverted. Therefore, the operation result f(ADD, PRM) of the arithmetic circuit 42 is an address ("00010 . . . 01100" (30 bits)) different from the address ADD. In other words, f(ADD, PRM) is an address obtained by performing an XOR operation using as inputs, the value of the address ADD and the value 5 (PRM). As described above, the conversion parameter PRM can also be referred to as information indicating a value used for changing the address ADD. The address conversion circuit 13 outputs f(ADD, PRM) as the address ADD1.

Figure 8:
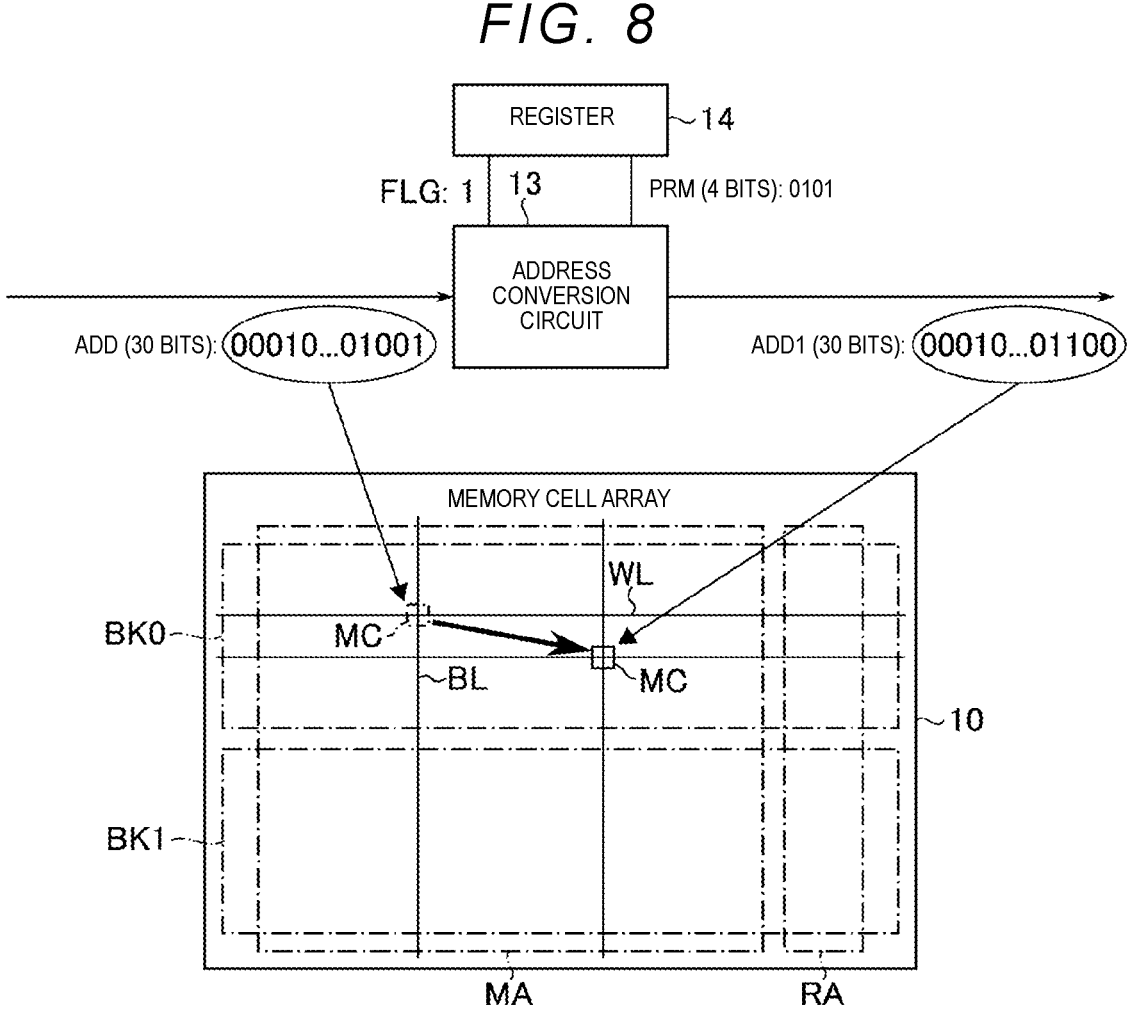
FIG. 8 is a diagram showing a relationship between a memory cell designated by an address before address translation and a memory cell designated by an address after address translation in FIG. 7.

FIG. 8 is a diagram showing a relationship between a memory cell MC designated by an address ADD before address conversion (hereinafter, referred to as a "memory cell MC before conversion") and a memory cell MC designated by an address ADD1 after address conversion (hereinafter, referred to as a "memory cell MC after conversion") in the example of FIG. 7. In FIG. 8, the memory cell MC before conversion is represented by a dotted line, and the memory cell MC after conversion is represented by a solid line.

As shown in FIG. 8, the address ADD ("00010 . . . 01001" (30 bits)) is converted into the address ADD1 ("00010 . . . 01100" (30 bits)) by the conversion function f. Accordingly, the memory cell MC after conversion refers to a memory cell MC different from the memory cell MC before conversion.

1.1.7 Conversion Parameter

The conversion parameter PRM will be described. The conversion parameter PRM for each of the chips CP may be set according to the below examples.

For example, the conversion parameter PRM for each of the chips CP may be set such that the converted address ADD1 of the chip CP0 is not changed from the address ADD, and the converted address ADD1 of the chip CPK (k is an integer of 1 or more and 7 or less) is an address obtained by performing an XOR operation using as inputs, the value of the address ADD and the value k. In this case, the conversion parameter PRM of the chip CP0 is set to 0, and the conversion parameter PRM of the chip CPk is set to k. That is, the conversion parameter PRM of the chip CP1 is an integer larger than the conversion parameter PRM of the chip CP0. The conversion parameter PRM of the chip CP2 is an integer larger than the conversion parameter PRM of the chip CP1. In addition, the difference between the conversion parameter PRM of the chip CP1 and the conversion parameter PRM of the chip CP0 is equal to the difference between the conversion parameter PRM of the chip CP2 and the conversion parameter PRM of the chip CP1.

For example, the conversion parameter PRM for each of the chips CP may be set such that the converted address ADD1 of the chip CP0 is not changed from the address ADD, and the converted address ADD1 of each of the chips CP1 to CP7 is an address obtained by performing an XOR operation using as inputs, the value of the respective address ADD and the same value (other than 0). In this case, the conversion parameter PRM of the chip CP0 is set to 0, and the conversion parameters PRM of the chips CP1 to CP7 are set to the same value (other than 0). That is, the conversion parameter PRM of the chip CP1 is an integer larger than the conversion parameter PRM of the chip CP0. The conversion parameter PRM of the chip CP2 is the same value as the conversion parameter PRM of the chip CP1.

For example, the conversion parameter PRM for each of the chips CP may be set such that the converted address ADD1 of the chip CP0 is not changed from the address ADD, and the converted address ADD1 of each of the chips CP1 to CP7 is an address obtained by performing an XOR operation using as inputs, the value of the respective address ADD and a random value (other than 0). In this case, the conversion parameter PRM of the chip CP0 is set to 0, and the conversion parameter PRM of each of the chips CP1 to CP7 is set to a random value (other than 0). The difference between the conversion parameter PRM of the chip CP1 and the conversion parameter PRM of the chip CP0 may be different from the difference between the conversion parameter PRM of the chip CP2 and the conversion parameter PRM of the chip CP1.

For example, the conversion parameter PRM of the chip CP0 may be set such that the converted address ADD1 of the chip CP0 becomes an address obtained by performing an XOR operation using as inputs, the value of the address ADD and any value (other than 0). That is, the conversion parameter PRM for each of the chips CP may be set such that the converted address ADD1 of each of the chips CP0 to CP7 is an address obtained by performing an XOR operation using as inputs, the value of the respective address ADD and any value (other than 0).

When the storage device 3 can be operated to acquire the information of the defective cell MC for each chip CP, the conversion parameter PRM for each chip CP may be set based on the acquired information of the defective cell MC.

1.2 Operation

The storage device 3 performs a setting operation and an address conversion operation. The setting operation is an operation of designating various settings for the address conversion described above. The address conversion operation is an operation of performing address conversion.

1.2.1 Setting Operation

Figure 9:
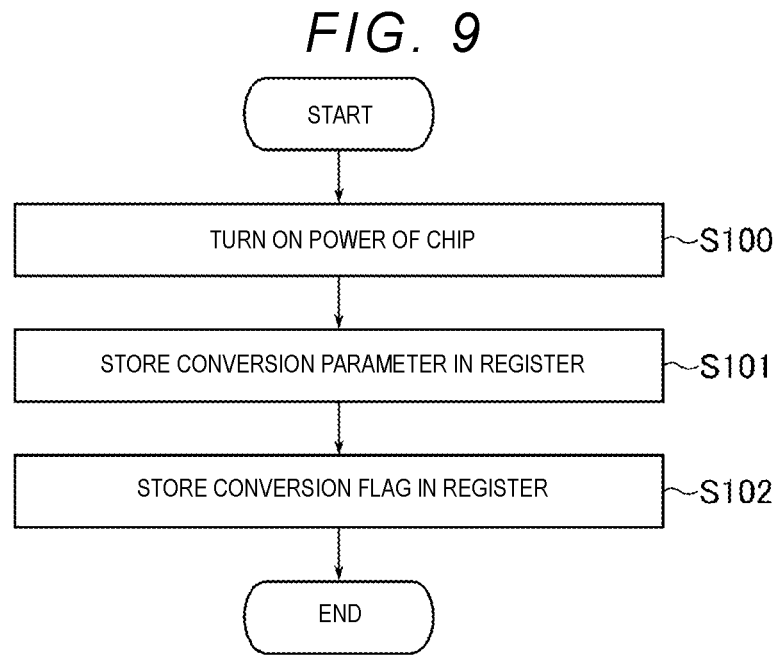
FIG. 9 is a flowchart showing an example of a setting operation of the storage device according to the first embodiment.

The setting operation will be described with reference to FIG. 9. FIG. 9 is a flowchart showing an example of a setting operation of the storage device 3.

When the power is turned on in the storage device 3, the power of a chip CP is turned on (S100).

When the power of the chip CP is turned on, the control unit 4 acquires the conversion flag FLG and the conversion parameter PRM stored in the ROM 6. The control unit 4 stores the acquired conversion parameter PRM in the register 14 (S101). Accordingly, the conversion parameter PRM is set in the chip CP. The control unit 4 stores the acquired conversion flag FLG in the register 14 (S102). Accordingly, in the chip CP, the address conversion is set to be enabled or disabled.

1.2.2 Address Conversion Operation

The address conversion operation will be described with reference to FIG. 10. FIG. 10 is a flowchart showing an example of an address conversion operation of the storage device 3. The address conversion operation is executed when a writing operation or a read operation (access to a plurality of chips CP) is performed. Hereinafter, a case where a writing operation is executed will be described as an example.

When the memory controller 2 transmits the command CMD (the command for the writing operation) and the address ADD, the chip CP receives the command CMD and the address ADD from the memory controller 2 through the control unit 4 (S110). The address ADD is transmitted to the address conversion circuit 13 through the input and output circuit 11.

When the address ADD is received from the memory controller 2, the address conversion circuit 13 acquires the conversion parameter PRM stored in the register 14. The address conversion circuit 13 executes the address conversion operation based on the acquired conversion parameter PRM (S111). The address ADD is converted, and the converted address ADD1 is transmitted to the decode circuit 15.

When the address ADD1 is received from the address conversion circuit 13, the decode circuit 15 decodes the address ADD1. The decode circuit 15 transmits the decode result to the row selection circuit 16 and the column selection circuit 17. The row selection circuit 16 selects the word line WL based on the decode result. The column selection circuit 17 selects the bit line BL based on the decode result. Accordingly, the chip CP selects the memory cell MC designated by the address ADD1 (S112).

When the memory cell MC is selected, the write and read circuit 19 performs a writing operation on the selected memory cell MC (S113). The address conversion operation is also executed in the same manner when the reading operation is executed.

1.3 Effects of Present Embodiment

According to the first embodiment, the defect rate, which is the proportion of the defective memory cells of the storage device 3, is reduced. Specifically, the defect rate of the storage device 3 refers to the proportion of defective cells MC with respect to all the memory cells MC in all of the main areas MA of all of the plurality of chips CP provided in the storage device 3. The proportion of defective memory cells for which it is difficult to properly execute the functional operations required for memory cells, including writing operations and reading operations, is referred to. The effect will be described below.

In a test before shipment of the storage device 3, for example, for each of the chips CP, a process (hereinafter, referred to as "redundancy relief") is performed in which the defective cell MC in the main area MA of the memory cell array 10 is made unusable and the redundancy cell MCr in the redundancy area RA of the memory cell array 10 is made usable in place of the defective cell MC. The correspondence relationship between the defective cell MC and the redundant cell MCr that is used instead of the defective cell MC, is stored in the ROM 6 of the control unit 4 for each chip CP, as the redundancy information RDI.

Even when the redundancy relief is performed, there is a possibility that the defective cell MC remains in the chip CP. Therefore the ECC circuit of the memory controller 2 performs an error correction process on any number of memory cells MC in all the chips CP in the storage device 3 as an error correction unit (hereinafter, referred to as an "ECC unit"). However, when the total number of error bits in each chip CP exceeds the number of bits that can be error-corrected in ECC units, there is a possibility that a defective cell MC that cannot be error-corrected may exist in the chip CP. That is, there is a possibility that the defective cell MC in the chip CP cannot be rescued.

When a plurality of chips CP of the same wafer are used in the storage device 3, when the memory cell MC at any address of a certain chip CP is a defective cell MC, the possibility that the memory cell MC at the same address of another chip CP is also a defective cell MC is relatively high. In such a case, when the address ADD is not converted, the memory cell MC designated by the same address ADD of the plurality of chips CP is accessed at the same time. In this case, as described above, there is an increased probability that a defective cell MC that cannot be error-corrected may be generated in the chip CP.

In contrast, the storage device 3 according to the present embodiment includes the control unit 4 and the plurality of chips CP. The control unit 4 includes a ROM 6. The ROM 6 stores the conversion parameter PRM for each chip CP. The chip CP includes the address conversion circuit 13. The address conversion circuit 13 converts the address ADD based on the conversion parameter PRM. Specifically, the address conversion circuit 13 inverts the designated bit(s) of the address ADD using the conversion parameter PRM. The address conversion circuit 13 transmits the converted address ADD1 to the decode circuit 15. Accordingly, it is possible to avoid access to the memory cell MC having a relatively high possibility of being a defective cell MC. Therefore, it is possible to reduce the probability of a defective cell MC that cannot be error-corrected existing in the chip CP. Therefore, the maximum number of defects of the memory cell MC in terms of ECC units is reduced. In addition, even if there are some chips CP having a relatively high proportion of defective cells with respect to all the memory cells MC in the respective main areas MA, the failure rate of the entire storage device 3 is minimized. Therefore, according to the present embodiment, it is possible to reduce the defect rate of the storage device 3.

Figure 11:
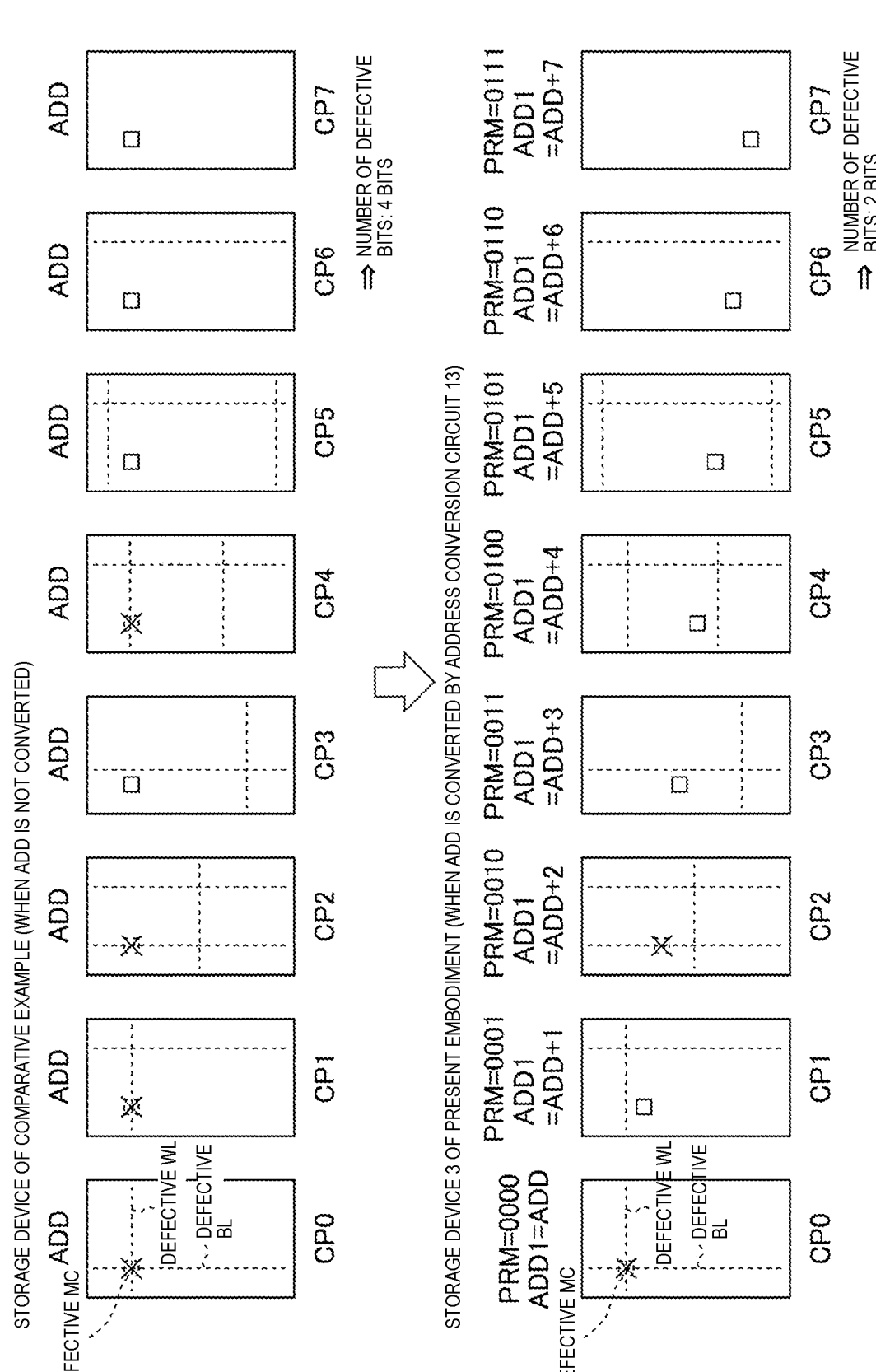
FIG. 11 is a diagram showing an error detection result in the storage device of the comparative example and the storage device according to the first embodiment.

FIG. 11 is a diagram showing error detection results by the ECC circuit in the storage device of the comparative example and the storage device 3 of the present embodiment. In FIG. 11, the word line WL indicated by a dotted line indicates a defective word line WL. The bit line BL indicated by a dotted line indicates a defective bit line BL. The square indicated by the dotted line indicates a defective cell MC. The square indicated by a solid line indicates a normal memory cell MC.

In the storage device of the comparative example, the address ADD is not converted in the chips CP0 to CP7, and the same address ADD is simultaneously accessed. As shown in FIG. 11, in the chips CP0 to CP7 in the storage device of the comparative example, a square represents a memory cell MC designated by the address ADD. Among the eight memory cells MC designated by the address ADD, four memory cells MC (the memory cells MC of the chips CP0, CP1, CP2, and CP4) are defective memory cells MC. Therefore, in the storage device of the comparative example, an error of 4 bits is detected by the ECC circuit.

On the other hand, in the storage device 3 of the present embodiment, in the chips CP0 to CP7, the address ADD is converted by the address conversion circuit 13, and the converted address ADD1 is accessed at the same time.

Specifically, the address conversion circuit 13 inverts designated bits of the address ADD using the conversion parameter PRM. The conversion parameter PRM of the chip CP0 is set to 0 ("0000"). The conversion parameter PRM of the chip CP1 is set to 1 ("0001"). The conversion parameter PRM of the chip CP2 is set to 2 ("0010"). The conversion parameter PRM of the chip CP3 is set to 3 ("0011"). The conversion parameter PRM of the chip CP4 is set to 4 ("0100"). The conversion parameter PRM of the chip CP5 is set to 5 ("0101"). The conversion parameter PRM of the chip CP6 is set to 6 ("0110"). The conversion parameter PRM of the chip CP7 is set to 7 ("0111"). The address ADD of the chip CP0 is not converted, but the address ADD of the chip CPK+1 (k is an integer of 0 or more and 6 or less) is converted into the address ADD1 by performing an XOR operation using as inputs, the value of the address ADD of the chip CPK+1 and the value k+1.

As shown in FIG. 11, in the chips CP0 to CP7 in the storage device 3 of the present embodiment, a square represents the memory cell MC designated by the address ADD1. Among the eight memory cells MC designated by the address ADD1, two memory cells MC (the memory cells MC of the chips CP0 and CP2) are defective cells MC. Therefore, in the storage device 3 of the present embodiment, an ECC circuit detects a 2-bit error.

As described above, the number of defective bits of the memory cell MC in the storage device 3 of the present embodiment is smaller than the number of defective bits of the memory cell MC in the storage device of the comparative example. Therefore, according to the present embodiment, the maximum number of defects of the memory cell MC in terms of ECC units is reduced.

1.4 First Modification Example

A storage device according to a first modification example of the first embodiment will be described. In the storage device according to the first modification example of the first embodiment, the conversion function f is different from that of the first embodiment. The following description will primarily describe the parts different from the first embodiment.

1.4.1 Conversion Function

The conversion function f is a function that vertically and horizontally changes a position in the main area MA of the memory cell array 10 designated by the address ADD based on the conversion parameter PRM. Specifically, the inversion of the position is designated by the conversion parameter PRM. The conversion function f vertically and horizontally changes the position designated by the address ADD based on the conversion parameter PRM. As a result, the address ADD is converted.

Figure 12:
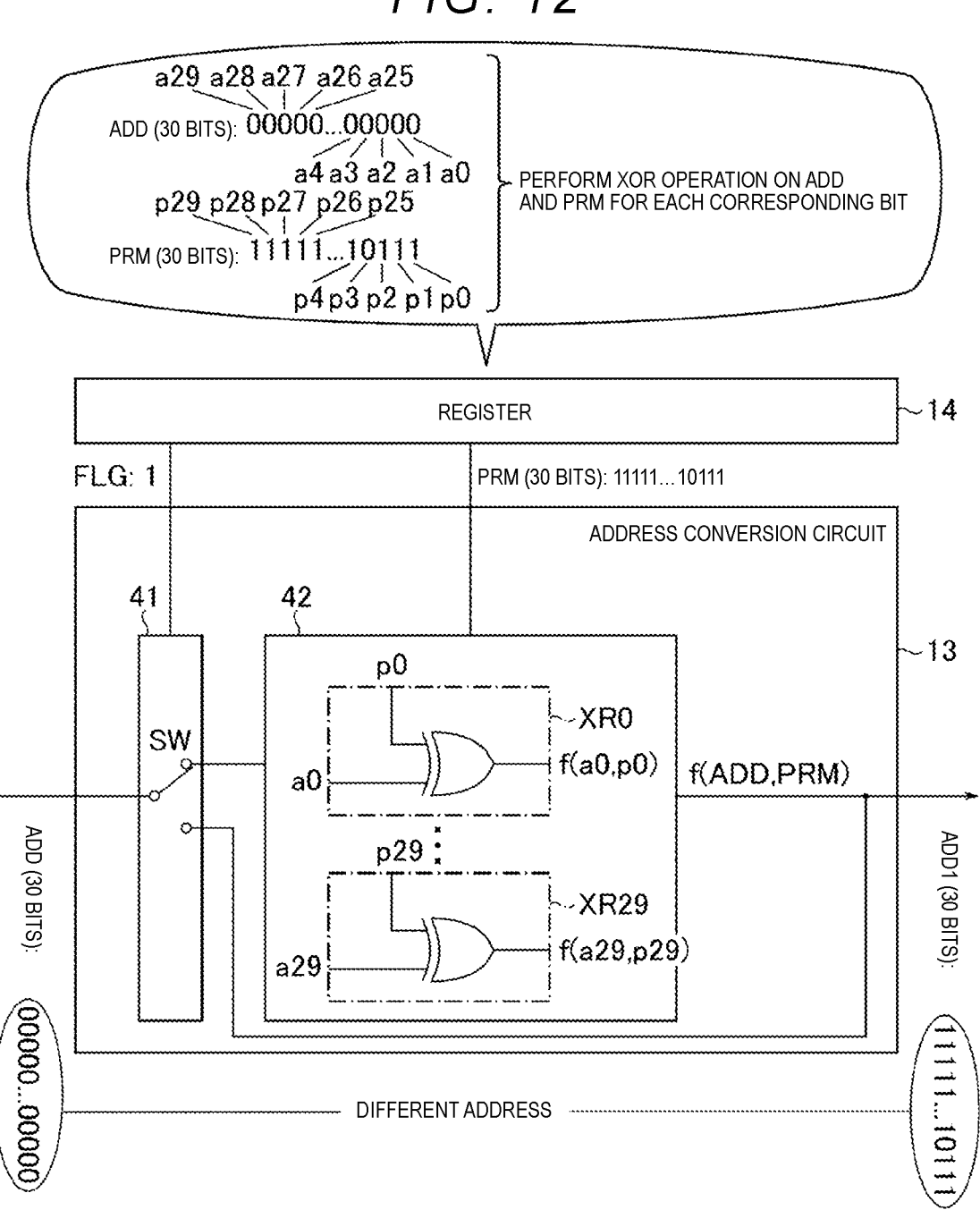
FIG. 12 is a diagram illustrating an example of a specific process of a conversion function used in an address conversion circuit provided in the storage device according to the first modification example of the first embodiment.

The details of the conversion function f will be described with reference to FIG. 12. FIG. 12 is a diagram illustrating an example of a specific process of the conversion function f.

"1" is set in the register 14 as the conversion flag FLG. As a result, the address conversion is validly set. For example, "11111 . . . 10111" (30 bits) is set as the conversion parameter PRM in the register 14. Hereinafter, the 30 bits of the conversion parameter PRM are referred to as p0 to p29.

The arithmetic circuit 42 includes, for example, 30 XOR circuits XR. Hereinafter, each of the 30 XOR circuits XR is denoted by XOR circuits XR0 to XR29, and each of the arithmetic results of the 30 XOR circuits XR is referred to as f(a0, p0) to f(a29, p29).

For example, "00000 . . . 00000" (30 bits) is input to the arithmetic circuit 42 as the address ADD. The arithmetic circuit 42 performs an XOR operation on the address ADD and the conversion parameter PRM for each corresponding bit. As a result of the XOR operation, f(a0, p0) is a value obtained by inverting the bit a0. f(a1, p1), f(a2, p2), and f(a4, p4) to f(a29, p29) are also the same. f(a3, p3) is a value at which the bit a3 is not inverted. Therefore, the operation result f(ADD, PRM) of the arithmetic circuit 42 is an address ("11111 . . . 10111" (30 bits)) different from the address ADD. The address conversion circuit 13 outputs f(ADD, PRM) as the address ADD1.

Figure 13:
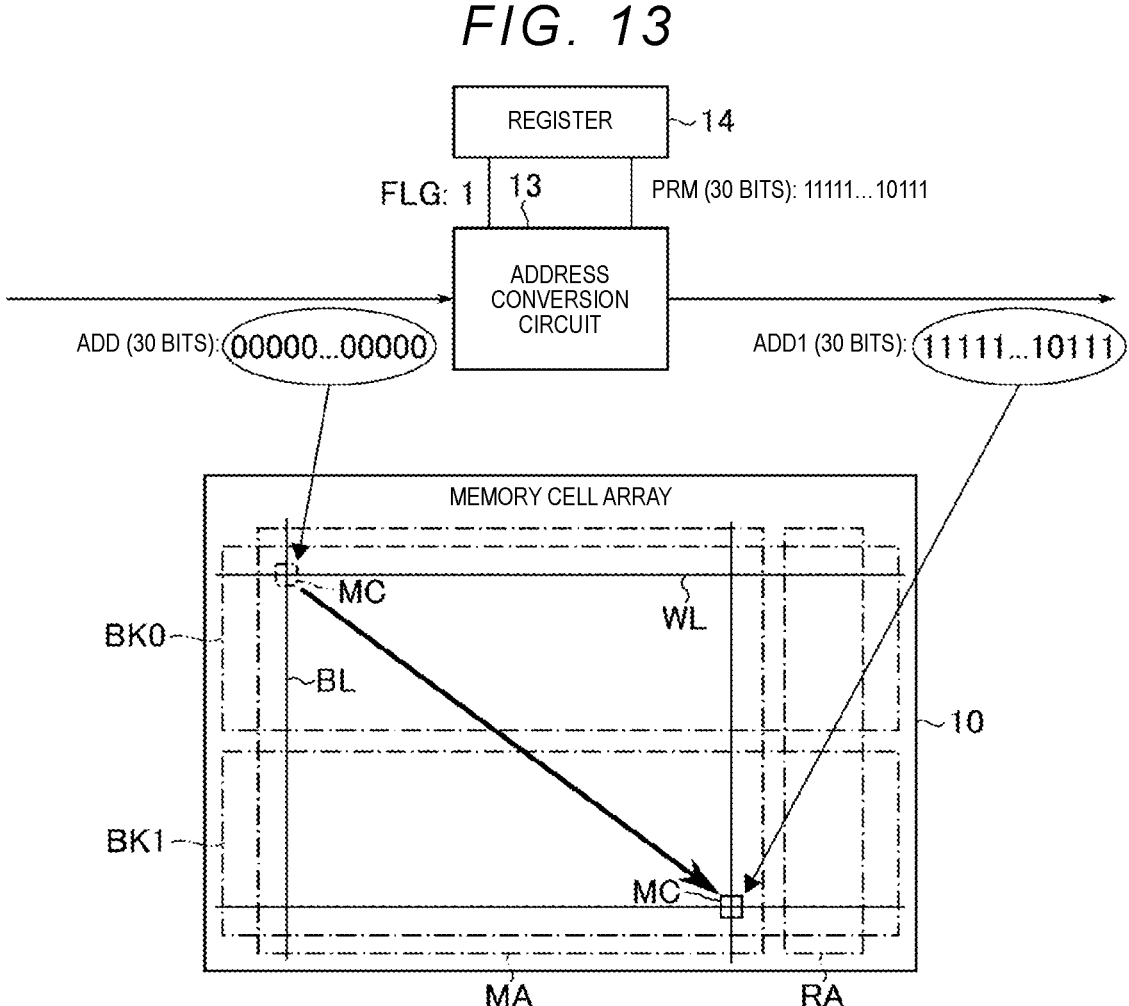
FIG. 13 is a diagram showing a relationship between a memory cell designated by an address before address conversion and a memory cell designated by an address after address conversion in FIG. 12.

FIG. 13 is a diagram showing a relationship between the memory cell MC before conversion and the memory cell MC after conversion in the example of FIG. 12. In FIG. 13, the memory cell MC before conversion is represented by a dotted line, and the memory cell MC after conversion is represented by a solid line.

As shown in FIG. 13, the address ADD ("00000 . . . 00000" (30 bits)) is converted into the address ADD1 ("11111 . . . 10111" (30 bits)) by the conversion function f. Accordingly, the memory cell MC after the conversion refers to a memory cell MC different from the memory cell MC before the conversion. In addition, in the main area MA, the memory cell MC after conversion is at a position obtained by vertically and horizontally changing the position of the memory cell MC before conversion.

Figure 14:
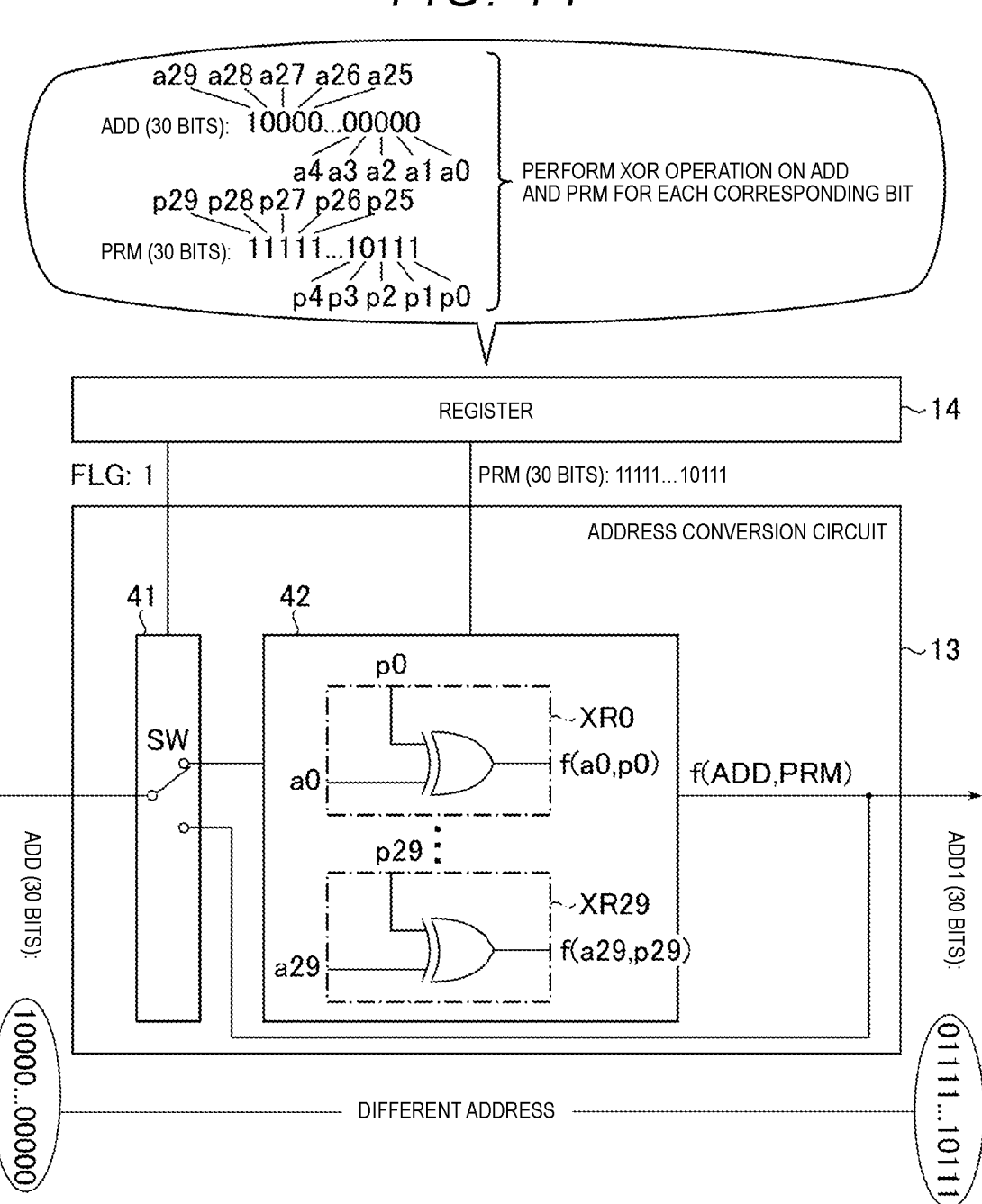
FIG. 14 is a diagram illustrating another example of the specific process of the conversion function used in the address conversion circuit provided in the storage device according to the first modification example of the first embodiment.

FIG. 14 is a diagram illustrating another example of the specific process of the conversion function f. In FIG. 14, the configuration is the same as that in the example of FIG. 12 except that the value of the address ADD is different.

For example, "10000 . . . 00000" (30 bits) is input to the arithmetic circuit 42 as the address ADD. The arithmetic circuit 42 performs an XOR operation on the address ADD and the conversion parameter PRM for each corresponding bit. As a result of the XOR operation, f(a0, p0) is a value obtained by inverting the bit a0. f(a1, p1), f(a2, p2), and f(a4, p4) to f(a29, p29) are also the same. f(a3, p3) is a value at which the bit a3 is not inverted. Therefore, the operation result f(ADD, PRM) of the arithmetic circuit 42 is an address ("01111 . . . 10111" (30 bits)) different from the address ADD. The address conversion circuit 13 outputs f(ADD, PRM) as the address ADD1.

FIG. 15 is a diagram showing a relationship between the memory cell MC before conversion and the memory cell MC after conversion in the example of FIG. 14. In FIG. 15, the memory cell MC before conversion is represented by a dotted line, and the memory cell MC after conversion is represented by a solid line.

As shown in FIG. 15, the address ADD ("10000 . . . 00000" (30 bits)) is converted into the address ADD1 ("01111 . . . 10111" (30 bits)) by the conversion function f. Accordingly, the memory cell MC after the conversion refers to a memory cell MC different from the memory cell MC before the conversion. In addition, in the main area MA, the memory cell MC after conversion is at a position obtained by vertically and horizontally changing the position of the memory cell MC before conversion.

1.4.2 Effect of Deformation Example

According to the present modification example, the same advantages as those of the first embodiment are exhibited.

1.5 Second Modification Example

A storage device according to a second modification example of the first embodiment will be described. In the storage device according to the second modification example of the first embodiment, the control unit 4, the address conversion circuit 13, and the conversion function f are different from those in the first embodiment. The following description primarily describes the parts different from the first embodiment.

1.5.1 Conversion Parameter

The conversion parameter PRM stored in the ROM 6 of the control unit 4 for each chip CP is further stored for each bank BK. That is, the ROM 6 stores the conversion parameters PRM0 to PRMi for each chip CP. The conversion parameters PRM0 to PRMi correspond to the banks BK0 to BKi, respectively. The conversion parameters PRM0 to PRMi for each of the chips CP are set in the same manner as in the first embodiment. Hereinafter, in order to simplify the description, a case where the number of banks BK is 2, that is, a case where the conversion parameters PRM0 and PRM1 are stored in the ROM 6 for each chip CP will be described as an example.

1.5.2 Configuration of Address Conversion Circuit

Figure 16:
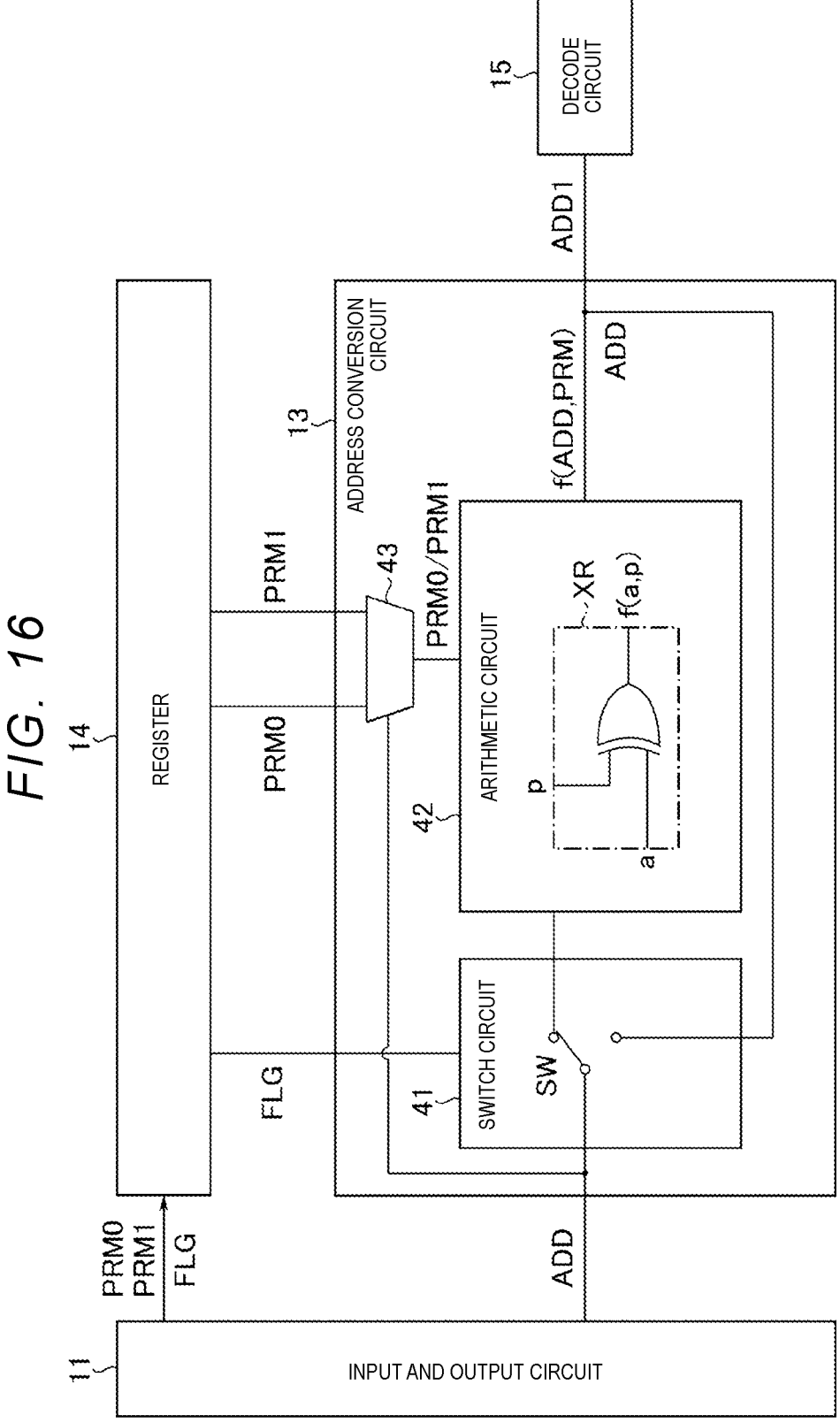
FIG. 16 is a circuit diagram showing an example of a configuration of an address conversion circuit in a memory chip provided in the storage device according to the second modification example of the first embodiment.

The configuration of the address conversion circuit 13 will be described with reference to FIG. 16. FIG. 16 is a circuit diagram showing an example of the configuration of the address conversion circuit 13. FIG. 16 also shows the input and output circuit 11, the register 14, and the decode circuit 15 together with the address conversion circuit 13.

As shown in FIG. 16, the address conversion circuit 13 includes a multiplexer 43 in addition to the configuration shown in the first embodiment.

The multiplexer 43 is a circuit that selects any of the conversion parameters PRM0 and PRM1. The multiplexer 43 is connected to the input and output circuit 11, the register 14, and the arithmetic circuit 42. The multiplexer 43 receives the address ADD from the input and output circuit 11. The multiplexer 43 receives the conversion parameters PRM0 and PRM1 from the register 14. The multiplexer 43 selects any of the conversion parameters PRM0 and PRM1 based on the address ADD. For example, the address ADD may be defined as an address in the bank BK0 when the most significant bit is "0", and may be defined as an address in the bank BK1 when the most significant bit is "1".

When the most significant bit of the address ADD is "0", the multiplexer 43 selects the conversion parameter PRM0. When the most significant bit of the address ADD is "1", the multiplexer 43 selects the conversion parameter PRM1. The multiplexer 43 transmits the selected conversion parameter PRM0 or PRM1 to the arithmetic circuit 42.

1.5.3 Conversion Function

The conversion function f is a function that inverts "0" and "1" for specified bits of the address ADD in the bank BKi based on the conversion parameter PRMi. Specifically, for example, the bit(s) to be inverted among all bits of the address ADD may be designated by the conversion parameter PRMi. The conversion function f inverts a bit(s) of the address ADD in the bank BKi using the conversion parameter PRMi. Accordingly, the address ADD is converted for each bank BKi.

Figure 17:
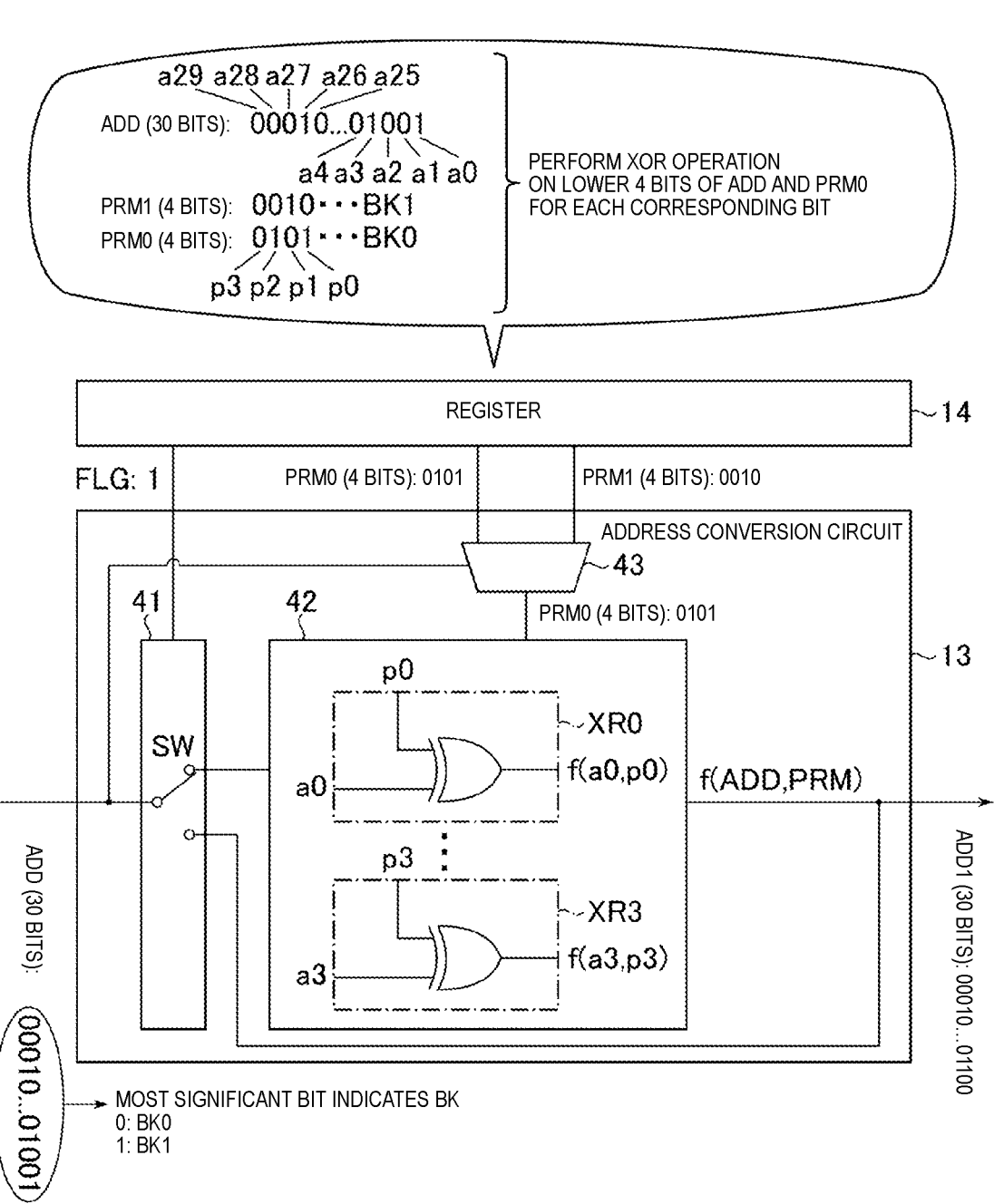
FIG. 17 is a diagram illustrating an example of a specific process of a conversion function used in an address conversion circuit provided in the storage device according to the second modification example of the first embodiment.

The details of the conversion function f will be described with reference to FIG. 17. FIG. 17 is a diagram illustrating an example of a specific process of the conversion function f.

"1" is set in the register 14 as the conversion flag FLG. As a result, the address conversion is validly set. For example, "0101" (4 bits) is set as the conversion parameter PRM0 in the register 14. For example, "0010" (4 bits) is set as the conversion parameter PRM1 in the register 14.

For example, "00010 . . . 01001" (30 bits) is input to the multiplexer 43 as the address ADD in the bank BK0. "0101" (4 bits) is input to the multiplexer 43 as the conversion parameter PRM0. "0010" (4 bits) is input to the multiplexer 43 as the conversion parameter PRM1. The multiplexer 43 selects the conversion parameter PRM0 based on the address ADD. The multiplexer 43 transmits the conversion parameter PRM0 to the arithmetic circuit 42.

The arithmetic circuit 42 is input with "00010 . . . 01001" (30 bits) as the address ADD in the bank BK0. The arithmetic circuit 42 performs an XOR operation on the lower 4 bits of the address ADD and the conversion parameter PRM0 for each corresponding bit. As a result of the XOR operation, f(a0, p0) is a value obtained by inverting the bit a0. f(a1, p1) is a value at which the bit a1 is not inverted. f(a2, p2) is a value obtained by inverting the bit a2. f(a3, p3) is a value at which the bit a3 is not inverted. Therefore, the operation result f(ADD, PRM) of the arithmetic circuit 42 is an address ("00010 . . . 01100" (30 bits)) different from the address ADD. In other words, f(ADD, PRM) is an address obtained by performing an XOR operation using as inputs, the value of the address ADD and the value 5. The address conversion circuit 13 outputs f(ADD, PRM) as the address ADD1.

Figure 18:
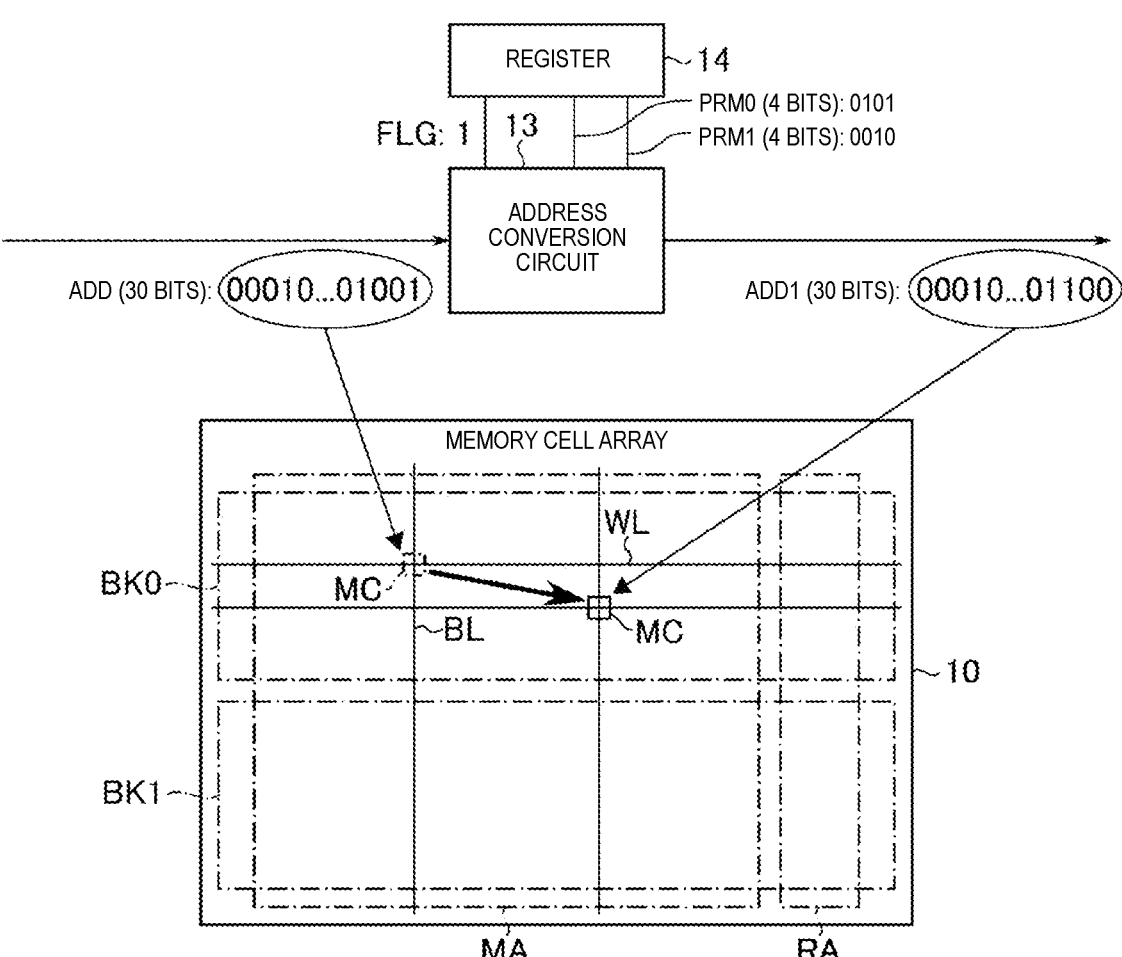
FIG. 18 is a diagram showing a relationship between a memory cell designated by an address before address conversion and a memory cell designated by an address after address conversion in FIG. 17.

FIG. 18 is a diagram showing a relationship between the memory cell MC before conversion and the memory cell MC after conversion in the example of FIG. 17. In FIG. 18, the memory cell MC before conversion is represented by a dotted line, and the memory cell MC after conversion is represented by a solid line.

As shown in FIG. 18, the address ADD ("00010 . . . 01001" (30 bits)) is converted into the address ADD1 ("00010 . . . 01100" (30 bits)) by the conversion function f. Accordingly, in the bank BK0, the converted memory cell MC indicates a memory cell MC different from the memory cell MC before the conversion.

Figure 19:
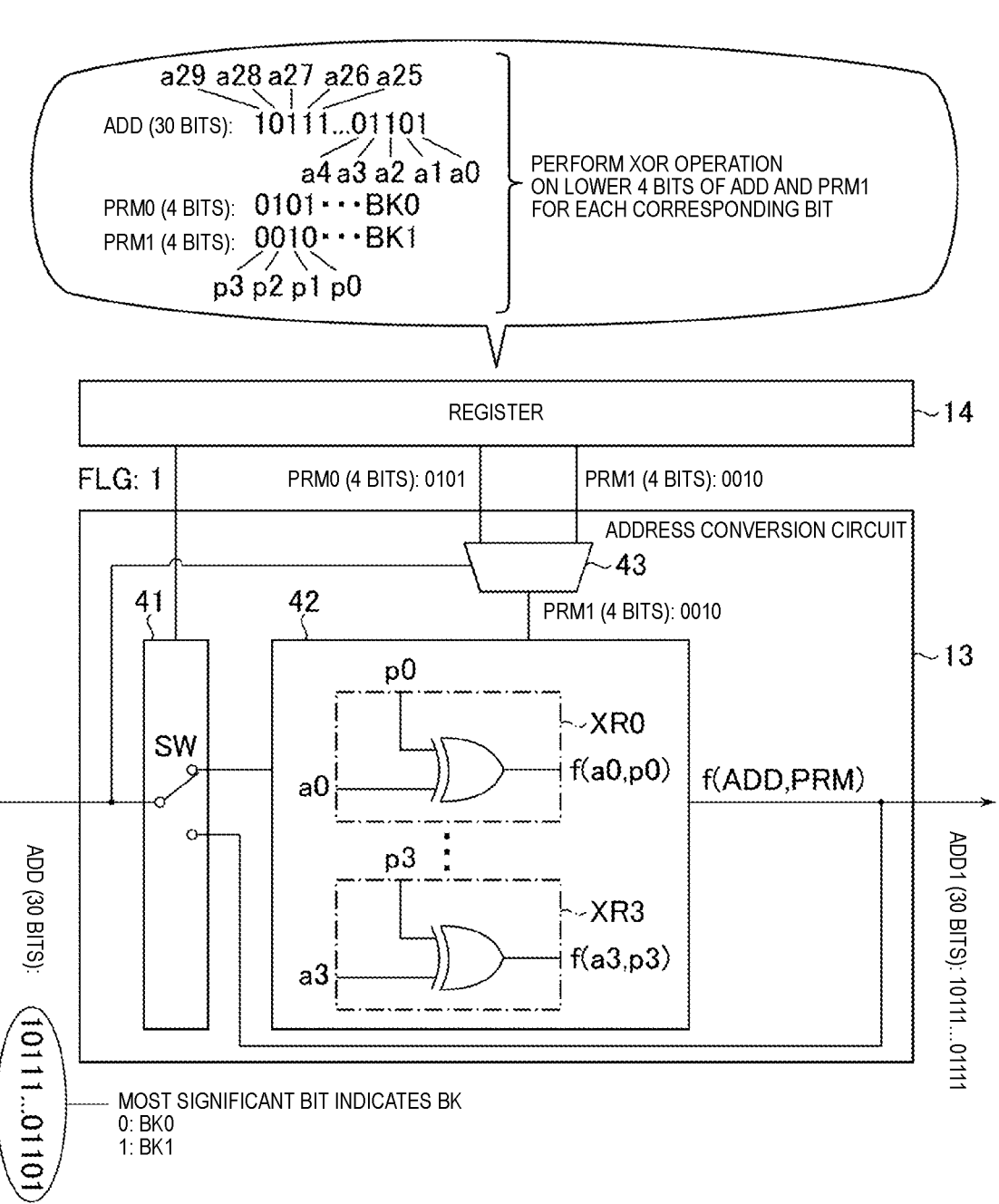
FIG. 19 is a diagram illustrating another example of the specific process of the conversion function used in the address conversion circuit provided in the storage device according to the second modification example of the first embodiment.

FIG. 19 is a diagram illustrating another example of the specific process of the conversion function f. In FIG. 19, the configuration is the same as that in the example in FIG. 17 except that the value of the address ADD is different.

For example, "10111 . . . 01101" (30 bits) is input to the multiplexer 43 as the address ADD in the bank BK1. The multiplexer 43 selects the conversion parameter PRM1 based on the address ADD. The multiplexer 43 transmits the conversion parameter PRM1 to the arithmetic circuit 42.

The arithmetic circuit 42 is input with "10111 . . . 01101" (30 bits) as the address ADD in the bank BK1. The arithmetic circuit 42 performs an XOR operation on the lower 4 bits of the address ADD and the conversion parameter PRM1 for each corresponding bit. As a result of the XOR operation, f(a0, p0) has a value in which the bit a0 is not inverted. f(a1, p1) is a value obtained by inverting the bit a1. f(a2, p2) is a value at which the bit a2 is not inverted. f(a3, p3) is a value at which the bit a3 is not inverted. Therefore, the operation result f(ADD, PRM) of the arithmetic circuit 42 is an address ("10111 . . . 01111" (30 bits)) different from the address ADD. In other words, f(ADD, PRM) is an address obtained by performing an XOR operation using as inputs, the value of the address ADD and the value 2 (PRM1). The address conversion circuit 13 outputs f(ADD, PRM) as the address ADD1.

Figure 20:
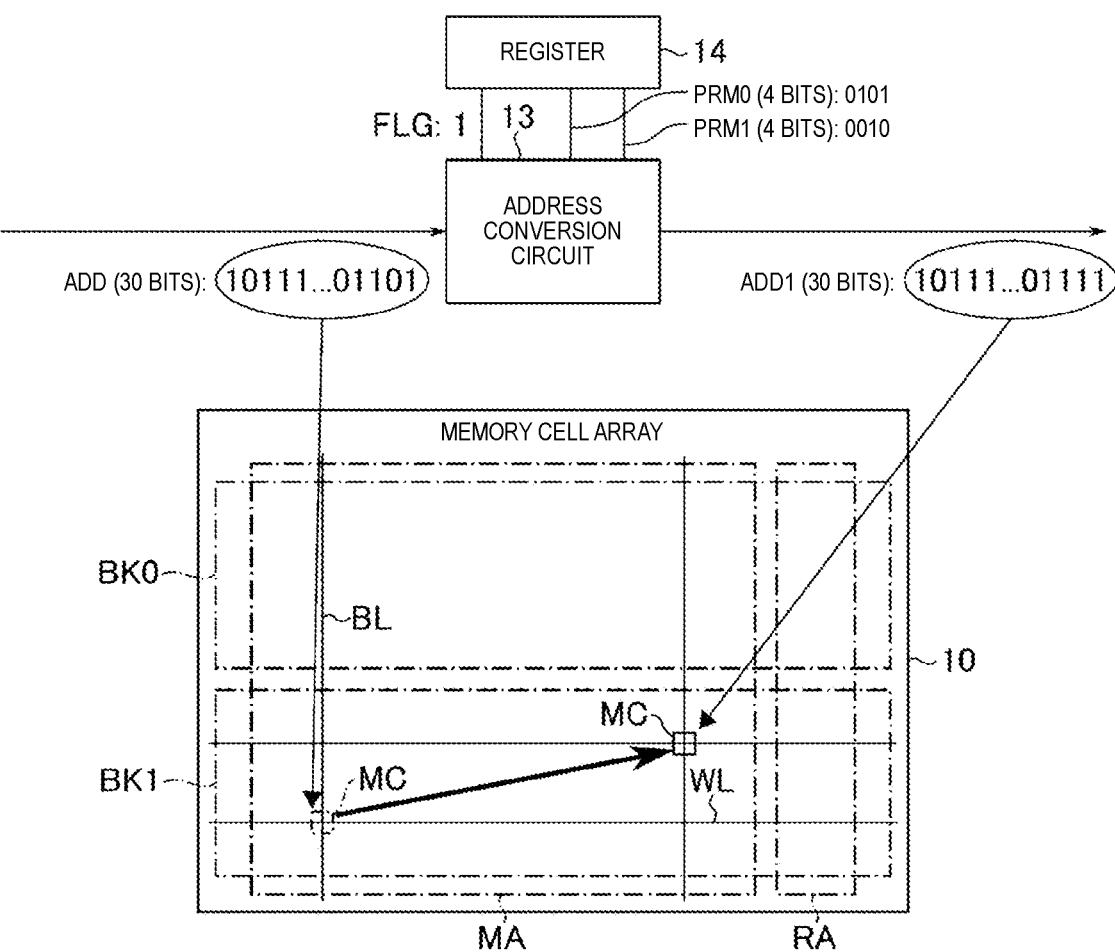
FIG. 20 is a diagram showing a relationship between a memory cell designated by an address before address conversion and a memory cell designated by an address after address conversion in FIG. 19.

FIG. 20 is a diagram showing a relationship between the memory cell MC before conversion and the memory cell MC after conversion in the example of FIG. 19. In FIG. 20, the memory cell MC before conversion is represented by a dotted line, and the memory cell MC after conversion is represented by a solid line.

As shown in FIG. 20, the address ADD ("10111 . . . 01101" (30 bits)) is converted into the address ADD1 ("10111 . . . 01111" (30 bits)) by the conversion function f. Accordingly, in the bank BK1, the converted memory cell MC indicates a memory cell MC different from the memory cell MC before the conversion.

1.5.4 Effect of Deformation Example

According to the present modification example, the same advantages as those of the first embodiment are exhibited.

2. Second Embodiment

A storage device according to a second embodiment will be described. In the storage device according to the second embodiment, the configuration of the chip CP is different from that of the first embodiment. The following description will primarily describe the parts different from the first embodiment.

2.1 Redundancy Information

The ROM 6 of the control unit 4 stores redundancy information (table) RDI for each chip CP. The redundancy information RDI will be described with reference to FIG. 21. FIG. 21 is a conceptual diagram showing an example of the redundancy information RDI.

The redundancy information RDI stores the address of the defective cell MC that is made unusable and the address of the redundancy cell MCr that is made usable in place of the defective cell MC. As shown in FIG. 21, each entry of the redundancy information RDI includes the address of the defective cell MC and the address of the redundancy cell MCr.

2.2 Configuration of Chip

A configuration of the chip CP will be described with reference to FIG. 22. FIG. 22 is a block diagram showing an example of the configuration of the chip CP.

The input and output circuit 11 receives the redundancy information RDI from the control unit 4 via the bus 5, in addition to the control signal CNT, the command CMD, the address ADD, the data (write data) DAT, the conversion flag FLG, and the conversion parameter PRM. The input and output circuit 11 transmits the redundancy information RDI to the register 14 in addition to the conversion flag FLG and the conversion parameter PRM.

The register 14 receives the redundancy information RDI from the input and output circuit 11 in addition to the conversion flag FLG and the conversion parameter PRM.

The chip CP includes the redundancy determination circuit 20 in addition to the configuration shown in the first embodiment.

The redundancy determination circuit 20 is a circuit that performs redundancy determination on the address ADD1 transmitted from the address conversion circuit 13. The redundancy determination is a process of determining whether the memory cell MC designated by the address ADD1 converted by the address conversion circuit 13 is a defective cell MC, for example.

The redundancy determination circuit 20 receives the address ADD1 from the address conversion circuit 13. The redundancy determination circuit 20 acquires the redundancy information RDI from the register 14. The redundancy determination circuit 20 searches the redundancy information RDI. When the address ADD1 is present as the address of the defective cell MC in the redundancy information RDI, the redundancy determination circuit 20 determines that the memory cell MC designated by the address ADD1 is the defective cell MC and is replaced with the redundancy cell MCr. In this case, the redundancy determination circuit 20 transmits the address of the redundancy cell MCr corresponding to the address ADD1 in the redundancy information RDI to the decode circuit 15 as the address ADD2. On the other hand, when the address ADD1 is not present as the address of the defective cell MC in the redundancy information RDI, the redundancy determination circuit 20 determines that the memory cell MC designated by the address ADD1 is not the defective cell MC. In this case, the redundancy determination circuit 20 transmits the address ADD1 as the address ADD2 to the decode circuit 15.

2.3 Redundancy Determination Operation

The storage device 3 performs a redundancy determination operation in addition to the address conversion operation. The redundancy determination operation is an operation of performing the redundancy determination described above. The redundancy determination operation is executed after the address conversion operation.

Figure 23:
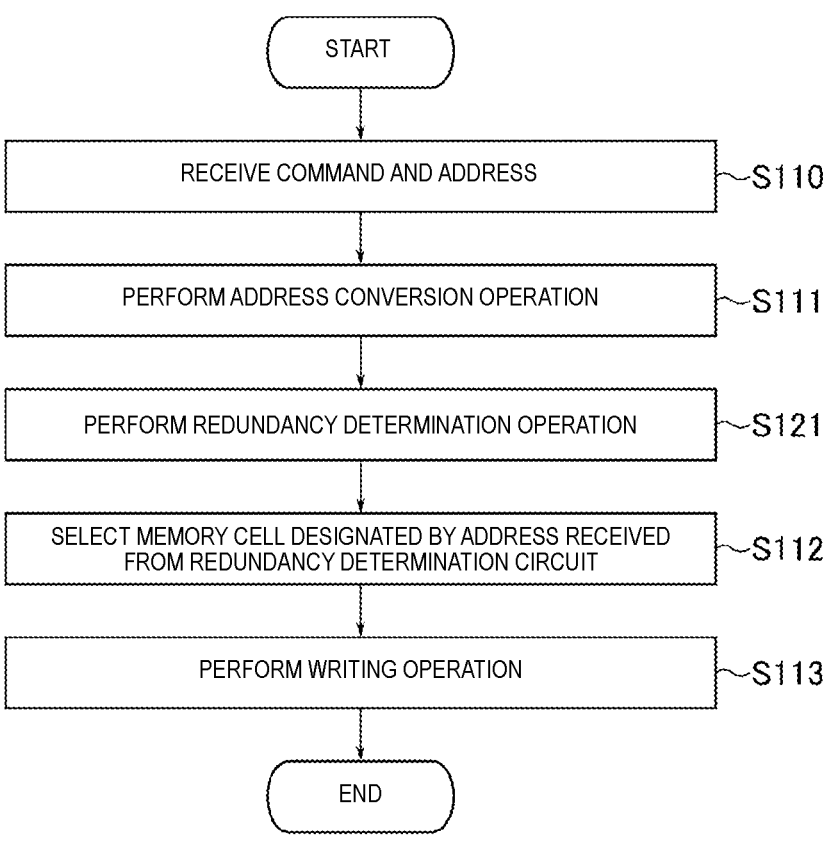
FIG. 23 is a flowchart showing an example of a redundancy determination operation of a memory chip provided in the storage device according to the second embodiment.

The redundancy determination operation will be described with reference to FIG. 23. FIG. 23 is a flowchart showing an example of a redundancy determination operation of the storage device 3. The redundancy determination operation is executed when a writing operation or a reading operation (access to a plurality of chips CP) is performed. Hereinafter, a case where a writing operation is executed will be described as an example. In FIG. 23, a step S121 is added between the steps S111 and S112 of FIG. 10 shown in the first embodiment.

When step S111 is executed in the same manner as in the first embodiment, the redundancy determination circuit 20 executes the redundancy determination operation (S121). After the redundancy determination operation is performed, the redundancy determination circuit 20 transmits the address ADD2 obtained by the redundancy determination operation to the decode circuit 15. After the address ADD2 is transmitted, steps S112 and S113 are executed based on the address ADD2, but otherwise in the same manner as in the first embodiment. The redundancy determination operation is also executed in the same manner when the reading operation is executed.

2.4 Effects of Present Embodiment

According to the present embodiment, the same advantages as those of the first embodiment is obtained.

In addition, after the address conversion operation is performed, the converted address ADD1 may be the address of the defective cell MC in the redundancy information RDI. The storage device 3 according to the present embodiment includes a redundancy determination circuit 20. The redundancy information RDI is stored in the ROM 6 of the control unit 4 for each chip CP. The redundancy determination circuit 20 determines whether the memory cell MC designated by the address ADD1 converted by the address conversion circuit 13 is the defective cell MC. When the address ADD1 is present as the address of the defective cell MC in the redundancy information RDI, the redundancy determination circuit 20 transmits the address of the redundancy cell MCr corresponding to the address ADD1 in the redundancy information RDI to the decode circuit 15 as the address ADD2. On the other hand, when the address ADD1 is not present as the address of the defective cell MC in the redundancy information RDI, the redundancy determination circuit 20 transmits the address ADD1 to the decode circuit 15 as the address ADD2. Accordingly, it is possible to avoid access to the memory cell MC stored as the defective cell MC in the redundancy information RDI. Of course, the first modification example and the second modification example of the first embodiment may also be applied to the storage device 3 according to the present embodiment.

3. Modification Examples

As described above, the storage device according to embodiments includes the first memory chip (CP0) including the plurality of first memory cells (MC) and the first circuit (13) that performs address conversion using the conversion function (f), and the second circuit (4) connected to the first memory chip (CP0). The second circuit (4) sets the first parameter (PRM) in the first memory chip (CP0). When the first address (ADD) is transmitted from the second circuit (4) to the first memory chip (CP0) and the first memory chip (CP0) is accessed, the first address (ADD) in the first memory chip (CP0) is converted into a second address (ADD1) by a conversion function (f) using a first parameter (PRM), and one of a plurality of first memory cells (MC) designated by the second address (ADD1) is accessed.

The embodiments are not limited to the above-described form, and various modifications may be made.

Further, in the flowcharts described in the above embodiments, the orders of the respective processes may be changed.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A storage device comprising:
   a first memory chip that includes:
      a plurality of first memory cells,
      a first address conversion circuit configured to perform address conversion by using first circuitry that applies bitwise inversion to designated bits of an address received by the first address conversion circuit, and
      a first address decode circuit separate from the first address conversion circuit and first circuitry, the first address decode circuit being configured to decode a converted address that is produced by the first address conversion circuit performing the address conversion using the first circuitry; and
   a control circuit that is connected to the first memory chip and that is configured to transmit a first parameter to the first memory chip, the first parameter designating bits to be inverted of the address received by the first address conversion circuit, wherein
   when a first address is transmitted to the first memory chip from the control circuit, the first address conversion circuit receives the first address as the address received by the first address conversion circuit and converts the first address into a second address different from the first address, by bitwise inverting bits of the first address that are designated by the first parameter, and then
   the first address decode circuit generates a decoded version of the second address, and one of the plurality of first memory cells that corresponds to the decoded version of the second address is accessed.

2. The storage device according to claim 1, wherein the first memory chip further includes a register that is configured to store the first parameter.

3. The storage device according to claim 1, wherein by converting the first address to the second address, the first address conversion circuit vertically and horizontally changes positions from the first address.

4. A storage device comprising:
   a first memory chip that includes:
      a plurality of first memory cells,
      an address conversion circuit configured to perform address conversion of an address received by the address conversion circuit, and
      a redundancy determination circuit configured to perform redundancy determination on a converted address that is produced by the address conversion circuit, the redundancy determination including searching redundancy information for the converted address produced by the address conversion circuit; and
   a control circuit that is connected to the first memory chip and that is configured to transmit a first parameter to the first memory chip, wherein
   when a first address is transmitted to the first memory chip from the control circuit, the address conversion circuit receives the first address as the address received by the address conversion circuit and converts the first address into a second address based on the first parameter,
   the redundancy determination circuit performs the redundancy determination on the second address as the converted address that is produced by the address conversion circuit, after the first address is converted into the second address, and
   one of the plurality of first memory cells that corresponds to the second address is accessed after the redundancy determination circuit performs the redundancy determination on the second address.

5. The storage device according to claim 4, wherein
   the redundancy information identifies a plurality of defective memory cells of the first memory chip, and
   the redundancy determination performed on the second address comprises the redundancy determination circuit determining whether the second address corresponds to one of the plurality of defective memory cells of the first memory chip.

6. The storage device according to claim 1, further comprising:
   a second memory chip connected to the control circuit, the second memory chip including:
      a plurality of second memory cells,
      a second address conversion circuit configured to perform address conversion by using second circuitry that applies bitwise inversion to designated bits of an address received by the second address conversion circuit, and
      a second address decode circuit configured to decode a converted address that is produced by the second address conversion circuit performing the address conversion using the second circuitry, wherein
   the control circuit is further configured to transmit a second parameter to the second memory chip, the second parameter designating bits to be inverted of the address received by the second address conversion circuit, and when the first address is transmitted to the second memory chip from the control circuit, the second address conversion circuit receives the first address as the address received by the second address conversion circuit and converts the first address into a third address different from the first address, by bitwise inverting bits of the first address that are designated by the second parameter, and then the second address decode circuit generates a decoded version of the third address, and one of the plurality of second memory cells corresponding to the decoded version of the third address is accessed.

7. The storage device according to claim 6, wherein the second parameter is an integer larger than the first parameter.

8. The storage device according to claim 6, further comprising:

a third memory chip connected to the control circuit, the third memory chip including:

a plurality of third memory cells, a third address conversion circuit configured to perform address conversion by using third circuitry that applies bitwise inversion to designated bits of an address received by the third address conversion circuit, and a third address decode circuit configured to decode a converted address that is produced by the third address conversion circuit performing the address conversion using the third circuitry, wherein the control circuit is further configured to transmit a third parameter to the third memory chip, the third parameter designating bits to be inverted of the address received by the third address conversion circuit, and when the first address is transmitted to the third memory chip from the control circuit, the third address conversion circuit receives the first address as the address received by the third address conversion circuit and converts the first address into a fourth address different from the first address, by bitwise inverting bits of the first address that are designated by the third parameter, and then the third address decode circuit generates a decoded version of the fourth address, and one of the plurality of third memory cells that corresponds to the decoded version of the fourth address is accessed.

9. The storage device according to claim 8, wherein the second address is different from the third address, and the second parameter is an integer larger than the first parameter, and the third parameter is an integer larger than the second parameter.

10. The storage device according to claim 9, wherein a difference between the second parameter and the first parameter is equal to a difference between the third parameter and the second parameter.

11. The storage device according to claim 9, wherein a difference between the second parameter and the first parameter is different from a difference between the third parameter and the second parameter.

12. The storage device according to claim 8, wherein the second address is the same as the third address, and the second parameter is an integer that is larger than the first parameter and that has the same value as the third parameter.

13. The storage device according to claim 1, wherein the plurality of first memory cells includes a variable resistance element.

14. The storage device according to claim 13, wherein the variable resistance element is a magnetoresistance effect element.

15. A driving method of a storage device that comprises a first memory chip and a control circuit, the first memory chip including a plurality of first memory cells, an address conversion circuit configured to perform address conversion of an address received by the address conversion circuit, and a redundancy determination circuit configured to perform redundancy determination on a converted address that is produced by the address conversion circuit, the redundancy determination including searching redundancy information for the converted address produced by the address conversion circuit, the control circuit being connected to the first memory chip, the driving method comprising:

transmitting, by the control circuit, a first parameter to the first memory chip;

when a first address is transmitted to the first memory chip from the control circuit, receiving, by the address conversion circuit, the first address as the address received by the address conversion circuit, and then converting, by the address conversion circuit, the first address into a second address based on the first parameter;

performing, by the redundancy determination circuit, the redundancy determination on the second address as the converted address that is produced by the address conversion circuit, after the first address is converted into the second address; and accessing one of the plurality of first memory cells that corresponds to the second address after the redundancy determination circuit performs the redundancy determination on the second address.

16. The driving method according to claim 15, wherein the redundancy information identifies a plurality of defective memory cells of the first memory chip, and the redundancy determination performed on the second address comprises the redundancy determination circuit determining whether the second address corresponds to one of the plurality of defective memory cells of the first memory chip.

* * * * *